United States Patent
Goto et al.

(10) Patent No.: US 7,221,013 B2
(45) Date of Patent: May 22, 2007

(54) SEMICONDUCTOR DEVICE

(75) Inventors: Satoru Goto, Osaka (JP); Yoshihisa Nagano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/916,645

(22) Filed: Aug. 12, 2004

(65) Prior Publication Data
US 2005/0051829 A1    Mar. 10, 2005

(30) Foreign Application Priority Data
Aug. 28, 2003    (JP)    ............... 2003-303964

(51) Int. Cl.
*H01L 27/108*    (2006.01)
*H01L 29/76*    (2006.01)
*H01L 31/119*    (2006.01)
*H01L 21/00*    (2006.01)

(52) U.S. Cl. ............... 257/296; 257/301; 257/303; 257/306; 257/307; 257/308; 257/309; 257/310; 438/3

(58) Field of Classification Search ............... 257/296, 257/301, 303, 306–310; 438/3
See application file for complete search history.

(56) References Cited

U.S. PATENT DOCUMENTS 5,677,226 A * 10/1997 Ishitani ............... 438/3
5,728,596 A * 3/1998 Prall ............... 438/586
6,437,387 B2 * 8/2002 Gutsche ............... 257/301

FOREIGN PATENT DOCUMENTS

JP    2002-198498 A    7/2002

* cited by examiner

*Primary Examiner*—Sara Crane
*Assistant Examiner*—Samuel A. Gebremariam
(74) *Attorney, Agent, or Firm*—McDermott Will & Emery LLP

(57) ABSTRACT

A semiconductor device includes: an insulating underlying layer of which surface portion has a concave portion; a lower electrode formed on the underlying layer along the inner face of the concave portion; a capacitor insulating film formed on the lower electrode and made of a high-dielectric or a ferroelectric subjected to thermal treatment for crystallization; and an upper electrode formed on the capacitor insulating film. The lower electrode and the upper electrode are made of a material that generates tensile stress in the thermal treatment for the capacitor insulating film, and the upper end part of the side wall and the corner part at the bottom face of the concave portion of the underlying layer are rounded.

4 Claims, 20 Drawing Sheets

SEMICONDUCTOR DEVICE

CROSS REFERENCE TO RELATED APPLICATIONS

This Non-provisional application claims priority under 35 U.S.C. § 119(a) on patent application No. 2003-303964 filed in Japan on Aug. 28, 2003, the entire contents of which are hereby incorporated by reference.

BACKGROUND ART

The present invention relates to a semiconductor device including a capacitor element that uses a ferroelectric or a high-dielectric as a material of a capacitor insulating film.

In recent years when demands for processing and storing a large amount of data are increasing in association with developments in digital technologies, electronic equipment grows more sofisticated and miniaturization of elements of semiconductor devices used therein progresses rapidly.

In association, in order to realize higher integration of dynamic random access memories (DRAMs), techniques have been widely developed in which high-dielectrics are used as capacitor insulating films instead of conventionally-used silicon oxide or silicon nitride (see, for example, Japanese Patent Application Laid Open Publication No. 2002-198498). Further, aiming at reducing to practical use nonvolatile RAMs capable of high speed writing and high speed reading with low operation voltage, which have been previously unatainable, research and development for ferroelectric films having spontaneous polarization are promoted.

The above gazette discloses that the external forms of capacitor elements are shaped into cubs such as columns, cylinders so that the capacitor value of each capacitor element is ensured while implementing miniaturization, namely, reducing the area (projection area) on a chip.

In the case where a high-dielectric or a ferroelectric is used as a material of a capacitor insulating film, it is necessary to perform annealing under an oxidizing atmosphere at a temperature of 700° C. to 800° C., which is a temperature for crystallization of the high-dielectric or the ferroelectric composing the capacitor insulating film, after formation of the capacitor insulating film. Accordingly, precious metals excellent in thermal resistance and oxidation resistance are used in general as materials of the electrodes in each capacitor element.

However, in the case where upper and lower electrodes made of a precious metal such as platinum (Pt), iridium (Ru) are formed into a solid of a column shape or of a concave shape in section formed in a concave portion in the underlying layer, the coverage at the edges or the corners of the solid becomes low, and accordingly, the thickness thereat is liable to be small. For this reason, migration is caused at a local part having a smaller thickness, which leads to breakage due to tensile stress at the annealing.

SUMMARY OF THE INVENTION

The present invention has its object of solving the above problems and preventing breakage of electrodes of a capacitor element in a solid shape caused by thermal treatment for the capacitor elements.

Wherein, it is noted that the above gazette discloses a method of rounding the upper end part of the electrode of the capacitor element, and has an object of moderating concentration of the electric filed generated at the corners of the electrodes.

To attain the above object, an edge part or a corner part of an underlying layer for forming a solid-shaped capacitor element is rounded in the present invention.

Specifically, a first semiconductor device according to the present invention includes: an underlying layer having an insulating property and having a concave portion in a surface portion; a lower electrode formed on the underlying layer along an inner face of the concave portion; a capacitor insulating film formed on the lower electrode and made of a high-dielectric or a ferroelectric subjected to thermal treatment for crystallization; and an upper electrode formed on the capacitor insulating film, wherein the lower electrode and the upper electrode are made of a material that generates tensile stress in the thermal treatment for the capacitor insulting film, and an upper end part of a side face and a corner part at a bottom face of the concave portion of the underlying layer are rounded.

According to the first semiconductor device, the coverage at the upper end part of the wall face and the corner part at the bottom face of the concave portion of the underlying layer is increased in formation of the electrodes. In association, stress caused by thermal contraction is applied uniformly on each electrode in the thermal treatment for the capacitor insulating film, and therefore, migration of atoms composing the electrodes is restrained, with a result that each electrode is prevented from breakage.

In the first semiconductor device, it is preferable that the side face of the concave portion forms an angle with the bottom face of the concave portion and an angle with a surface of the underlying layer respectively at 93 degrees to 130 degrees. In so doing, the coverage of the electrodes is further increased, and therefore, each electrode is further surely prevented form breakage.

In this case, in each of the lower electrode and the upper electrode, it is preferable that a thickness ratio of a thinnest part in a part located on the inner face of the concave portion to a part located on the underlying layer is 0.6 or more.

A second semiconductor device according to the present invention includes: a lower electrode in an island shape formed on an underlying layer; a capacitor insulating film formed on the underlying layer so as to cover the lower electrode and made of a high-dielectric or a ferroelectric subjected to thermal treatment for crystallization; and an upper electrode formed on the capacitor insulating film, wherein the upper electrode is made of a material that generates tensile stress in the thermal treatment for the capacitor insulating film, an upper end part of the lower electrode is rounded, and a lower end part of the lower electrode is formed in an outwardly extended shape.

According to the second semiconductor device, the coverage at pats of the upper electrode respectively corresponding to the upper end part and the lower end part of the lower electrode is increased. In association, stress caused by thermal contraction is applied uniformly on the upper electrode in the thermal treatment for the capacitor insulating film, and therefore, migration of atoms composing the upper electrode is restrained, with a result that the upper electrode is prevented from breakage.

A third semiconductor device according to the present invention includes: a lower electrode in an island shape formed on an underlying layer; a capacitor insulating film formed on the underlying layer so as to cover the lower electrode and made of a high-dielectric or a ferroelectric subjected to thermal treatment for crystallization; and an upper electrode formed on the capacitor insulating film, wherein the upper electrode: is made of a material that generates tensile stress in the thermal treatment for the capacitor insulating film, an upper end part of the lower electrode is rounded, and a region where the underlying layer extends outwardly from the lower electrode is formed in an inwardly curved shape.

According to the third semiconductor device, the coverage at the parts of the upper electrode respectively corresponding to the upper end part of the lower electrode and the region where the underlying layer is connected to the side face of the lower electrode is increased. In association, stress caused by thermal contraction is applied uniformly on the upper electrode in the thermal treatment for the capacitor insulating film, and therefore, migration of atoms composing the upper electrodes is restrained, with a result that the upper electrode is prevented from breakage.

In the second or third semiconductor device, it is preferable that the side face of the lower electrode forms an angle with a surface of the underlying layer at 93 degrees to 130 degrees.

In this case, in the upper electrode, it is preferable that a thickness ratio of a thinnest part in a part located on a top face and a side face of the lower electrode to a part located on the underlying layer is 0.6 or more.

In the first to third semiconductor devices, in each of the upper electrode and the lower electrode, it is preferable to set a thickness of a thinnest part 10 nm or more. By this setting, breakage by migration caused due to this thinning is prevented even with uniformed coverage.

A fourth semiconductor device according to the present invention includes: a first lower electrode in an island shape formed on an underlying layer; a mask film that covers a top face of the first lower electrode; a second lower electrode formed on the underlying layer so as to cover the mask film and the first lower electrode; a capacitor insulating film formed on the second lower electrode and made of a high-dielectric or a ferroelectric subjected to thermal treatment for crystallization; and an upper electrode formed on the capacitor insulating film, wherein the second lower electrode and the upper electrode are made of a material that generates tensile stress in the thermal treatment for the capacitor insulating film, and an upper end part of the mask film is rounded.

According to the fourth semiconductor device, the coverage at respective parts of the upper electrode and the second lower electrode corresponding to the upper end part of the mask film is increased in the formation thereof. In association, stress caused by thermal contraction is applied uniformly on each electrode in the thermal treatment for the capacitor insulating film, and therefore, migration of atoms composing the upper electrodes is restrained. As a result, each electrode is prevented from breakage.

In the fourth semiconductor device, it is preferable that a side face of the first lower electrode forms an obtuse angle with a surface of the underlying layer. In so doing, the coverage at respective parts of the upper electrode and the second lower electrode corresponding to the periphery of the lower end part of the first lower electrode is increased. Hence, the upper electrode and the second lower electrode are surely prevented from breakage.

In the fourth semiconductor device, it is preferable that a periphery of a lower end part of the first lower electrode is formed in an outwardly extended shape. In so doing, the coverage at respective parts of the upper electrode and the second lower electrode corresponding to the periphery and the vicinity of the lower end part of the first lower electrode is increased, so that the upper electrode and the second lower electrode are further surely prevented from breakage.

Further, in the fourth semiconductor device, it is preferable that a region where the underlying layer extends outwardly from the first lower electrode is formed in an inwardly curved shape. In so doing, the coverage at respective parts of the upper electrode and the second lower electrode respectively corresponding to the periphery of the lower part of the first lower electrode and the vicinity of the region is increased, with a result that the upper electrode and the second lower electrode are further surely prevented from breakage. In addition, when the region where the underlying layer extends outwardly from the first lower electrode is formed in an inwardly curved shape, the capacitance element increases its height, with a result of increases in the area where the second lower electrode faces the upper electrode and in the capacitor value of the capacitor element.

In the fourth semiconductor device, it is preferable that a side face of the first lower electrode forms an angle with a surface of the underlying layer at 93 degrees to 130 degrees.

In this case, in each of the second lower electrode and the upper electrode, it is preferable that a thickness ratio of a thinnest part in a part located on a top face of the mask film and in a part located on the side face of the first lower electrode to a part located on the underlying layer is 0.6 or more.

In the fourth semiconductor device, in each of the upper electrode and the second lower electrode, it is preferable to set a thickness of a thinnest part 10 nm or more. By this setting, breakage by migration caused due to this thinning is prevented even with uniformed coverage.

In the fourth semiconductor device, it is preferable that the mask film is made of silicon oxide, silicon nitride, aluminum oxide, titanium, titanium oxide, tantalum, tantalum oxide, aluminum titanium oxide or aluminum titanium nitride.

In the first to fourth semiconductor device, it is preferable that the capacitor insulating film is made of at least one material selected from the group consisting of $Pb(Zr_xTi_{1-x})O_3$, $(Ba_xSr_{1-x})TiO_3$, $SrBi_2(Ta_xNb_{1-x})_2O_9$, $(Bi_xLa_{1-x})_4Ti_3O_{12}$ (wherein, $0 \leq x \leq 1$ in each the substance) and $Ta_2O_5$.

In the first to fourth semiconductor device, it is preferable that the upper electrode and the second lower electrode are made of at least one material selected from the group consisting of platinum, ruthenium, ruthenium oxide, iridium, iridium oxide, aluminum titanium, aluminum titanium nitride, titanium, titanium nitride, tantalum and tantalum nitride.

In the first to fourth semiconductor device, it is preferable that the capacitor insulating film is crystallized by thermal treatment under an oxidizing atmosphere at a temperature of 650° C. to 800° C.

DETAILED DESCRIPTION OF THE INVENTION (First Embodiment)

A first embodiment of the present invention will be described below with reference to drawings.

Figure 1:
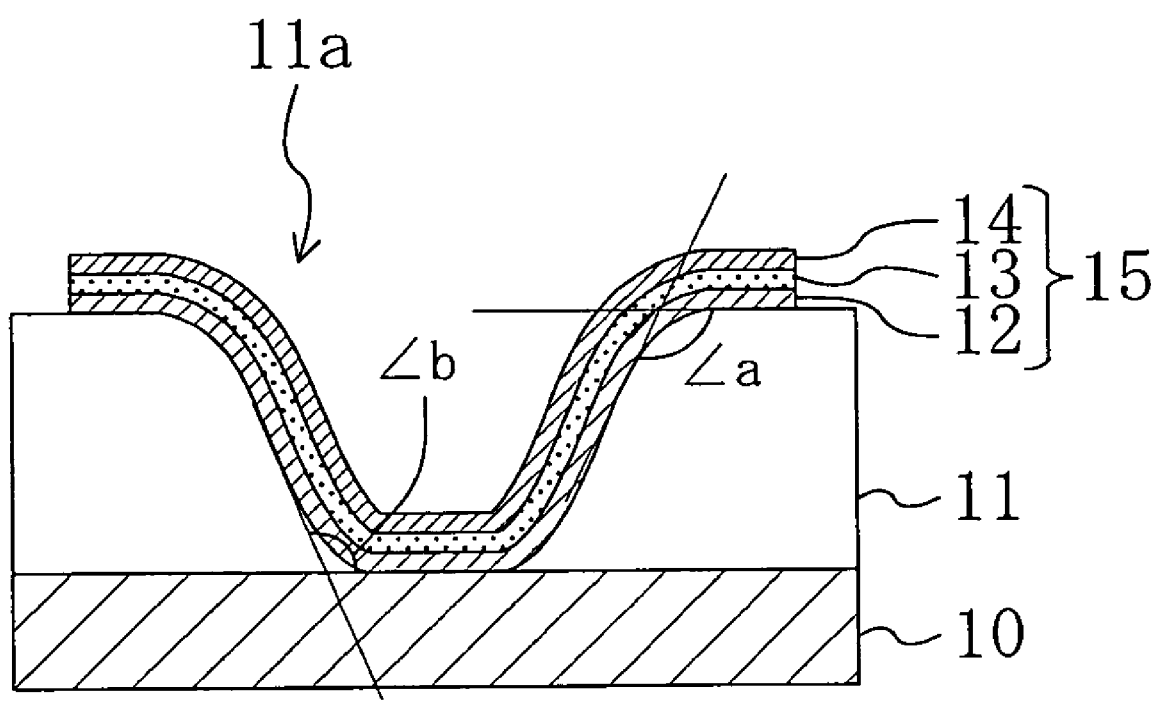
FIG. 1 is a section showing the main part of a semiconductor device (concave capacitor element) according to a first embodiment of the present invention.

FIG. 1 shows a so-called concave capacitor element having a concave shape in section, which is a semiconductor device according to the first embodiment of the present invention.

As shown in FIG. 1, an underlying insulating layer 11 which has a concave portion 11a having an opening diameter of 400 nm and a thickness of about 400 nm of which principal component is silicon oxide is formed on a semiconductor substrate 10 made of, for example, silicon (Si). There are formed in this order on the underlying insulating layer 11 along the inner face of the concave portion 11a a lower electrode 12 made of platinum (Pt) of about 40 nm in thickness, a capacitor insulting film 13 made of a ferroelectric, such as strontium bismuth tantalum niobate ($SrBi_2(Ta_xNb_{1-x})_2O_9$: hereinafter referred to merely as SBTN, wherein $0 \leq x \leq 1$) of about 60 nm in thickness, and an upper electrode 14 made of platinum (Pt) of about 40 nm in thickness. The lower electrode 12, the capacitor insulating film 13 and the upper electrode 14 compose a capacitor element 15.

Referring to one of significant features of the first embodiment, an upper end part of the wall face of the concave portion 11a and a corner part at the bottom face of the concave portion 11a of the underlying insulating layer 11 forming the capacitor element 15 are rounded.

Further, opening angles of the concave portion 11a, namely, an angle (∠a) formed by the wall face of the concave portion 11a with the surface of the underlying insulating layer 11 and an angle (∠b) formed by the wall face of the concave portion 11a with the principal surface of the semiconductor substrate 10, are both obtuse.

Figure 2:
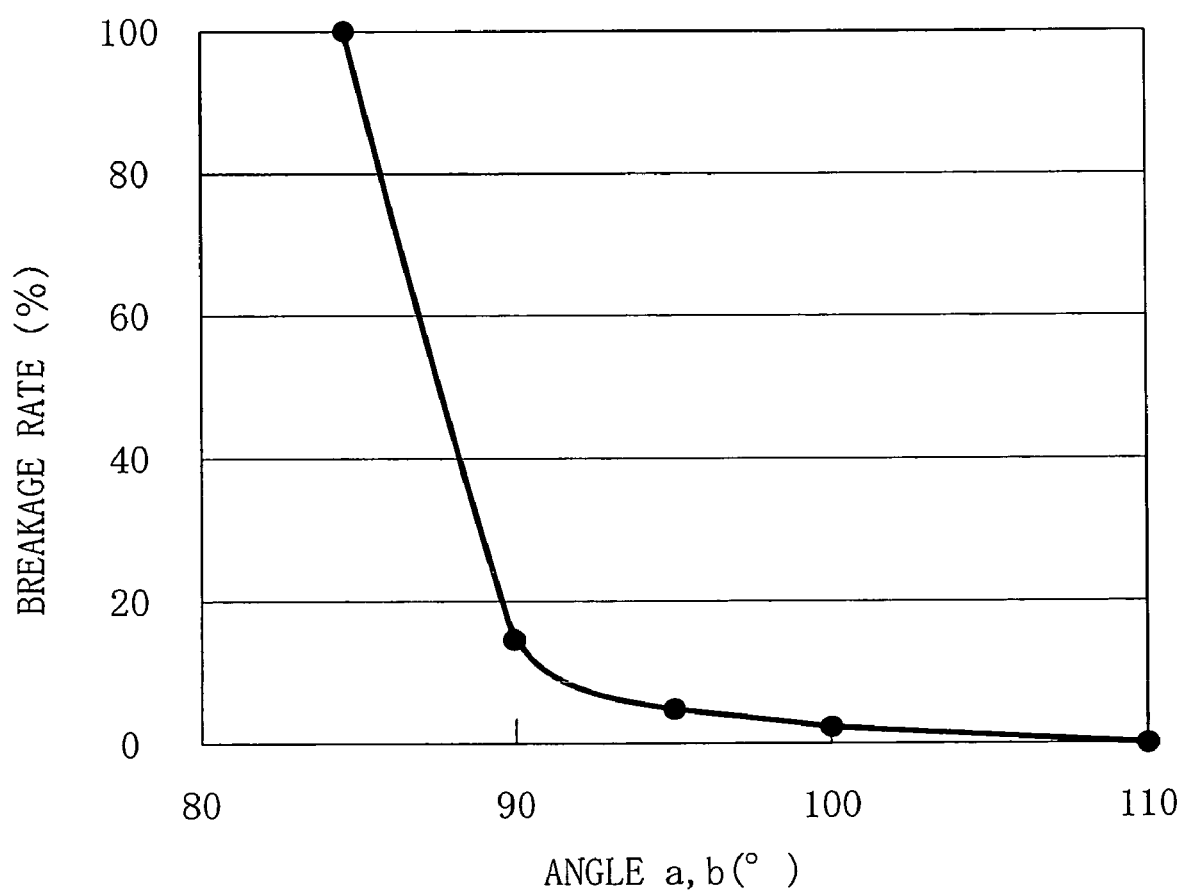
FIG. 2 is a graph representation indicating a relationship between a breakage rate of an electrode and an angle of an open edge of an underlying layer forming the semiconductor device according to the first embodiment at a concave portion of the present invention.

FIG. 2 shows a relationship between the opening angles (∠a and ∠b) of the underlying insulating layer 11 and a breakage rate of the lower electrode 12 and the upper electrode 14. As shown in FIG. 2, when the opening angles of the concave portion 11a are set in the range between 93 degrees and 110 degrees, respectively, the breakage rate of the electrodes 12, 14 is remarkably small compared with the case of 85 degrees (acute angle). Further, with a view to reducing the projection area of the capacitor element 15, the opening angles (∠a and ∠b) are preferably set in the range between 95 degrees and 100 degrees.

Figure 3:
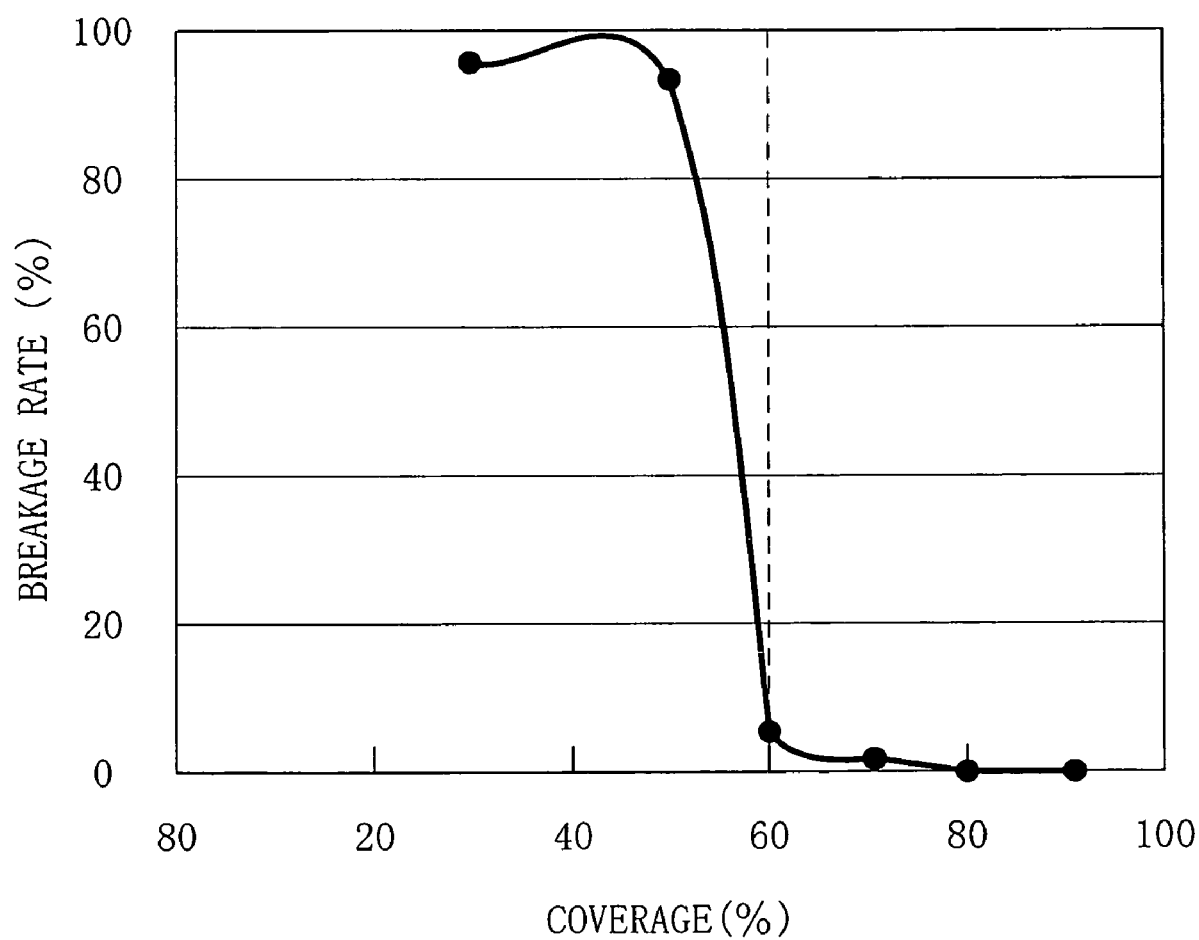
FIG. 3 is a graph representation indicating a relationship between coverage and the breakage rate of the electrode in the case where the angle of the open edge at the concave portion of the underlying layer forming the semiconductor device according to the first embodiment of the present invention is set 95°.

FIG. 3 shows a relationship between coverage and the breakage rate of the electrode in the case where the opening angels (∠a and ∠b) of the concave portion 11a are set 95 degrees. Wherein, in the present description, the coverage means a ratio (percentage) of the thickness of a part where the lower electrode 12 becomes thinnest on the inner face of the concave portion 11a with respect to the thickness of a part of the lower electrode 12 located on the underlying insulating layer 11, for example. As can be understood from FIG. 3, when an electrode having coverage of 60% or more are formed, the breakage rate of the electrode is reduced remarkably to a level where no problem in manufacture is involved.

Figure 4:
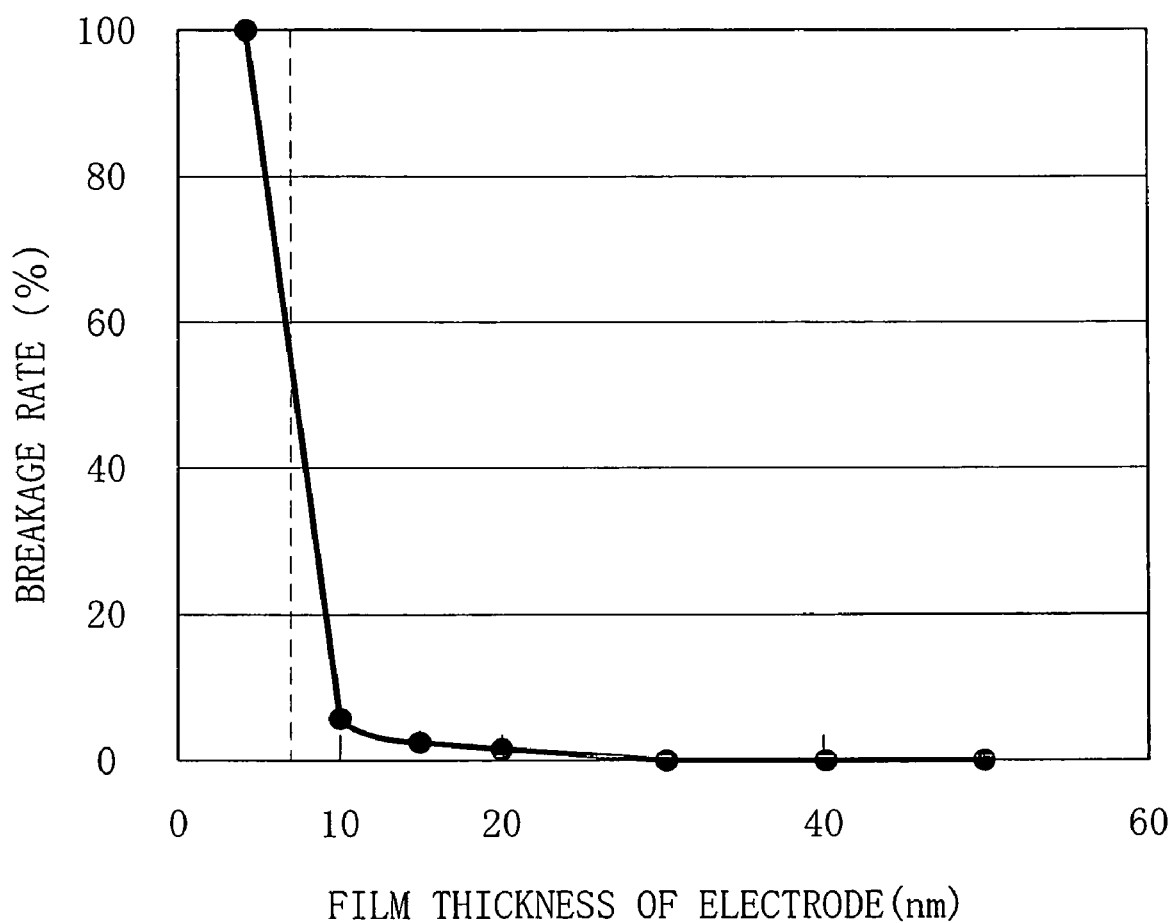
FIG. 4 is a graph representation indicating a relationship between the film thickness of the electrode and the breakage rate in the semiconductor device according to the first embodiment of the present invention.

The present inventors have knowledge that the thickness of electrodes themselves has a lower limit even if the coverage is enhanced, as shown in FIG. 4. It is understood from FIG. 4 that setting of the thickness of the electrodes 10 nm or more reduces remarkably the breakage rate of the electrode to a level where no problem in manufacture is involved.

As described above, with the concave capacitor element 15 of the first embodiment, in which the opening angles ($\angle$a and $\angle$b) of the concave portion 11a formed in the underlying insulating layer 11 are obtuse and the corner part at the bottom face and the edge part of the wall face upper end of the concave portion 11a are both rounded, the coverage at the respective corner parts and the respective edge parts of the lower electrode 12 and the upper electrode 14 is increased. In association, stress on the lower electrode 12 and the upper electrode 14 caused by thermal contraction is uniformed in thermal treatment for crystallization of the capacitor insulating film 13, so as to restrain migration of atoms composing the electrodes 12, 14, with a result that each electrode 12, 14 can be prevented from breakage.

It is noted that the corner part at the bottom face and the edge part of the wall face upper end of the concave portion 11a in the underlying insulating layer 11 are rounded in the first embodiment but only either one thereof may be rounded.

In addition, the principal surface of the semiconductor substrate 10 and the lower electrode 12 are connected electrically to each other in the capacitor element 15 in the first embodiment, but the present invention is not limited thereto. For example, in the case using a stack memory cell in which a transistor for enabling the capacitor element 15 to be accessible is formed on the semiconductor substrate 10 and the capacitor element 15 is formed above the transistor with the underlying insulating layer 11 intervened, a contact for electrical conduction between a source or a drain of the transistor and the lower electrode 12 of the capacitor element 15 may be formed.

(First Manufacturing Method)

Figure 5A:
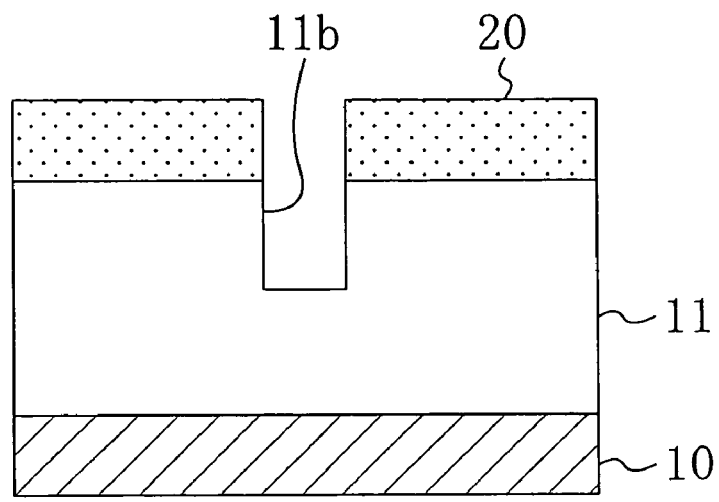
FIG. 5A to FIG. 5C are sections showing the process sequence of a first semiconductor device manufacturing method according to the first embodiment of the present invention.
Figure 5B:
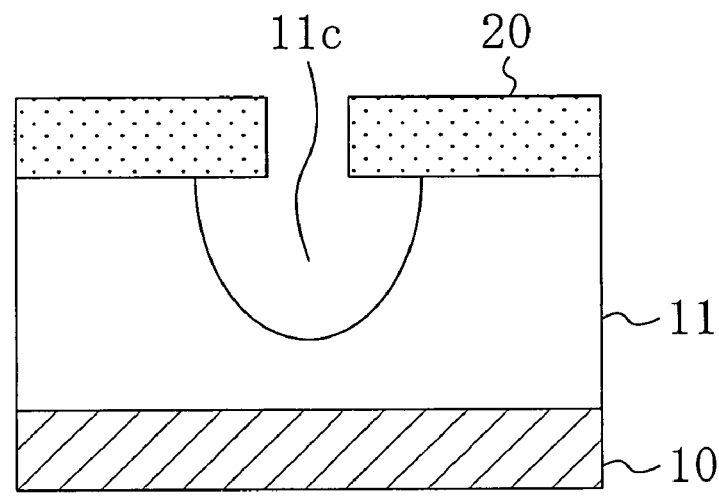
Figure 5C:
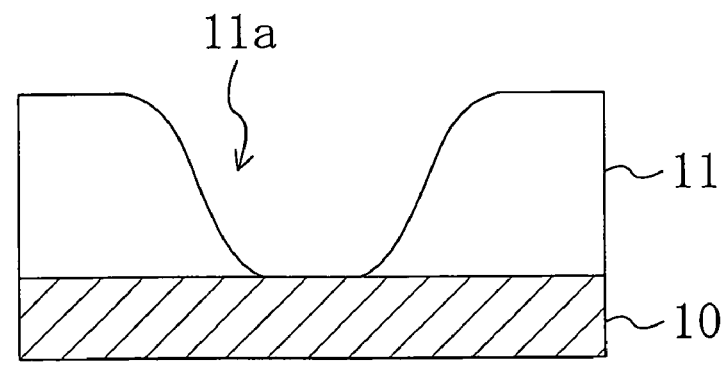
Figure 6A:
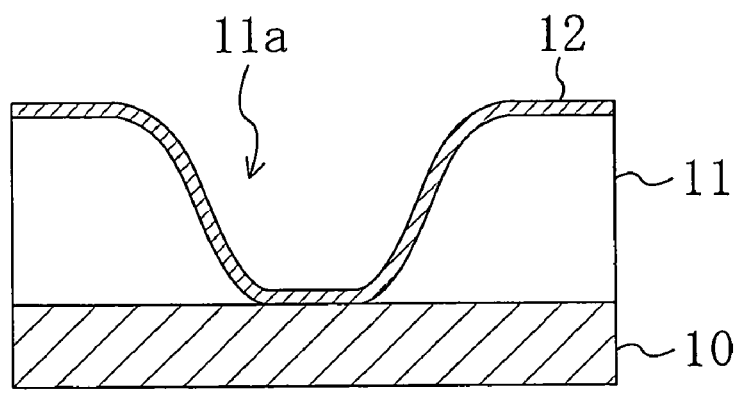
FIG. 6A to FIG. 6C are sections showing the process sequence of the first semiconductor device manufacturing method according to the first embodiment of the present invention.
Figure 6B:
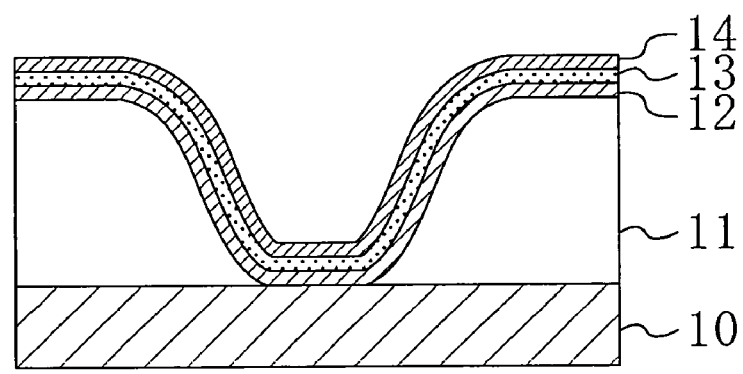
Figure 6C:
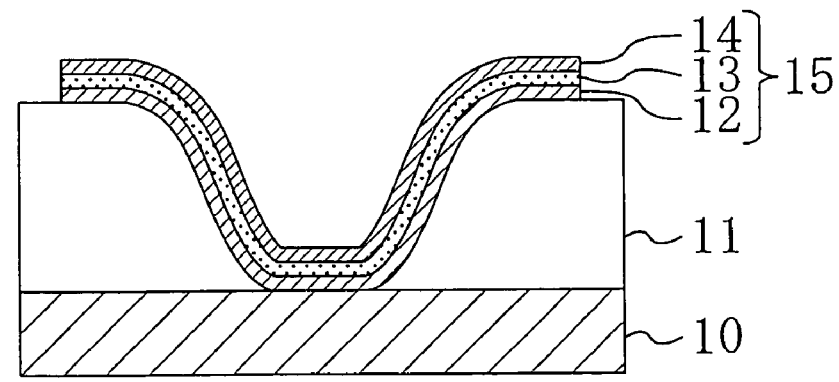

A first method for manufacturing a capacitor element constructed as above will be described below with reference to drawings. FIG. 5A to FIG. 5C and FIG. 6A to FIG. 6C show the process sequence of the method for manufacturing a semiconductor device in section according to the first embodiment. In FIG. 5 and FIG. 6, the same reference numerals are assigned to the same members as those in FIG. 1.

First, as shown in FIG. 5A, an underlying insulating layer 11 of which principal component is silicon oxide of about 500 nm in thickness is deposited on a semiconductor substrate 10 by chemical vapor deposition (CVD). Then, a resist mask 20 having an opening pattern for capacitor element formation of which opening diameter is smaller than a concave portion is formed on the underlying insulating layer 11 by lithography, and anisotropic etching with an etching gas of which principal components are, for example, trifluoromethyl ($CHF_3$) and oxygen ($O_2$) is performed to the underlying insulating layer 11 using the thus formed resist mask 20, thereby forming a first-stage concave portion 11b in the underlying insulating layer 11. Herein, it is significant that the bottom face of the first-stage concave portion 11b does not reach the semiconductor substrate 10.

Next, as shown in FIG. 5B, wet etching using, for example, a buffered hydrofluoric acid (mixed solution of HF and $NH_4F$) as an etchant is performed to the underlying insulating layer 11, with the resist mask 20 left, thereby forming a second-stage concave portion 11c. Herein, the bottom face of the first-stage concave portion 11b does not reach the semiconductor substrate 10, also. By this isotropic wet etching, the wall face of the second-stage concave portion 11c is rounded in an outwardly curved shape.

Next, as shown in FIG. 5C, after the resist mask 20 is removed by ashing, dry etching with an etching gas of which principal components are $CHF_3$ and $O_2$ is performed to the entirety of the underlying insulating layer 11, thereby obtaining a concave portion 11a in a desired shape of which upper end part of the wall face and the corner part at the bottom face are both rounded and from the bottom face of which the semiconductor substrate 10 is exposed.

Next, as shown in FIG. 6A, a lower electrode 12 made of platinum (Pt) of about 40 nm in thickness is deposited on the entirety of the underlying insulating layer 11 including the inner face of the concave portion 11a by sputtering or metal organic chemical vapor deposition (MOCVD).

Next, as shown in FIG. 6B, a capacitor insulating film 13 made of SBTN of about 60 nm in thickness is deposited on the lower electrode 12 by sputtering or MOCVD. Then, an upper electrode 14 made of platinum (Pt) of about 40 nm in thickness is deposited on the capacitor insulting film 13 by sputtering or MOCVD.

Next, as shown in FIG. 6C, the upper electrode 14, the capacitor insulating film 13 and the lower electrode 12 are patterned to desired shapes by lithography or dry etching. In the patterning performed in this time, a gas containing chlorine may be used for the upper electrode 14 and the lower electrode 12 and a gas containing fluorine or chlorine (e.g., $CHF_3$, $C_4F_8$ or $CCl_4$) may be used for the capacitor insulating film 13. Then, thermal treatment under an oxidizing atmosphere at a temperature of 650° C. to 800° C. is performed to the thus patterned capacitor insulating film 13 for crystallization of the ferroelectric composing the capacitor insulating film 13.

According to the first manufacturing method, the opening angles ($\angle$a and $\angle$b) of the concave portion 11a formed in the underlying insulating film 11 can be obtuse and the corner part at the bottom face and the edge part of the wall face upper end of the concave portion 11a can be rounded as well. Therefore, the coverage at parts of the lower electrode 12 and the upper electrode 14 respectively corresponding to the corner part at the bottom face and the edge part of the upper end of the concave portion 11a is increased, so that stress on the lower electrode 12 and the upper electrode 14 caused by thermal contraction is uniformed in the thermal treatment for crystallization of the capacitor insulating film. Thus, breakage to be generated in each electrode 12, 14 can be prevented.

(Second Manufacturing Method)

Another method for forming a concave portion of an underlying insulating layer will be described below as a second method for manufacturing a semiconductor device according to the first embodiment of the present invention, with reference to FIG. 7A to FIG. 7B.

Figure 7A:
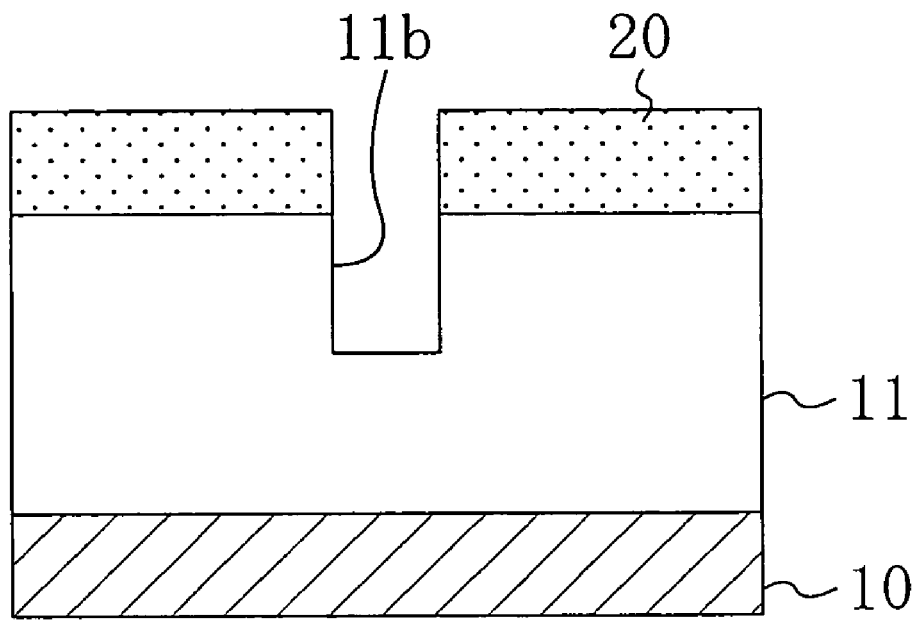
FIG. 7A and FIG. 7B are sections showing the process sequence of a second semiconductor device manufacturing method according to the first embodiment of the present invention.

First, as shown in FIG. 7A, an underlying insulating layer 11 of which principal component is silicon oxide of about 500 nm in thickness is deposited on a semiconductor substrate 10 by CVD. Then, a resist mask 20 for capacitor element formation having an opening pattern of which opening diameter is smaller than a concave portion is formed on the underlying insulating layer 11 by lithography, and anisotropic etching with an etching gas of which principal components are, for example, $CHF_3$ and $O_2$ is performed to the underlying insulating layer 11 using the thus formed resist mask 20, thereby forming a first-stage concave portion 11b in the underlying insulating layer 11. Herein, the bottom face of the first-stage concave portion 11b does not reach the semiconductor substrate 10.

Figure 7B:
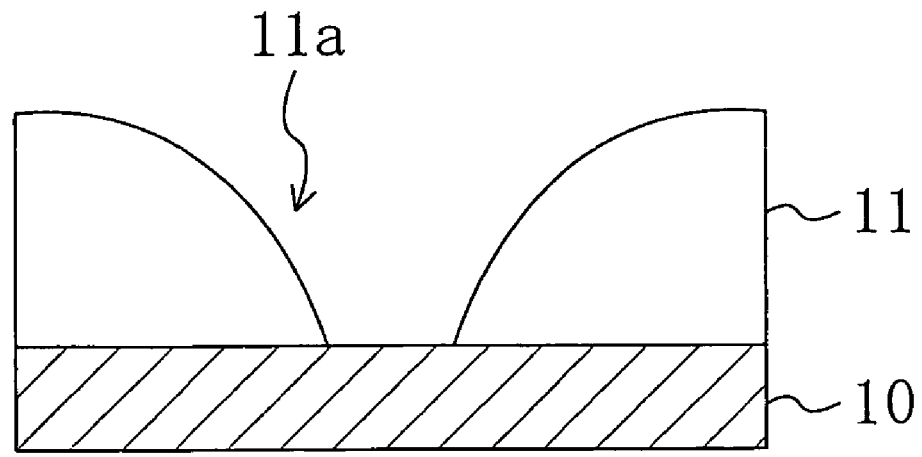

Subsequently, as shown in FIG. 7B, after the resist mask 20 is removed by ashing, dry etching with an etching gas of which principal components are $CHF_3$ and $O_2$ is performed again to the entirety of the underlying insulating layer 11, thereby obtaining a desired concave portion 11a of which upper end part of the wall face is rounded and from the bottom face of which the semiconductor substrate 10 is exposed. Thereafter, a lower electrode 12, a capacitor insulating film 13 and an upper electrode 14 are formed in the same manner as in the first manufacturing method.

Referring to the difference between the first manufacturing method and the second manufacturing method, the dry-etched amount of the underlying insulating layer 11 can be reduced by the combination of the dry etching and the wet etching in the first manufacturing method, with a result of enhancement of throughput for formation of the concave portion 11a. On the other hand, in the second manufacturing method, the upper end part of the wall face thereof becomes gentler, with a result that 60% or more coverage of the lower electrode 12 and the upper electrode 14 in the concave portion 11a can be attained surely.

(Second Embodiment)

A second embodiment of the present invention will be described below with reference to drawings.

Figure 8:
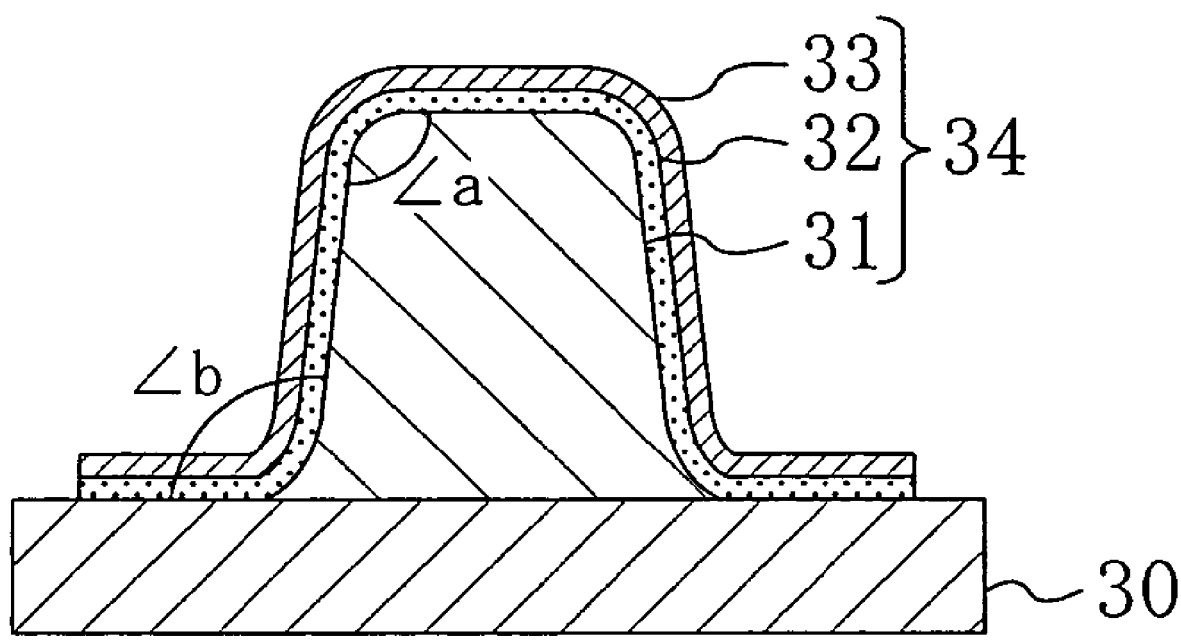
FIG. 8 is a section showing the main part of the semiconductor device (column capacitor element) according to a second embodiment of the present invention.

FIG. 8 shows a capacitor element having a column shape in section, which is a semiconductor device according to the second embodiment of the present invention.

As shown in FIG. 8, a lower electrode 31 made of platinum in a column shape (island shape) of about 400 nm in diameter and of about 400 nm in height is formed on a semiconductor substrate 30 made of silicon (Si) as an underlying layer. On the lower electrode 31, a capacitor insulting film 32 made of a ferroelectric, for example, SBTN of about 60 nm in thickness, and an upper electrode 33 made of platinum of about 40 nm in thickness are formed so as to cover the lower electrode 31. The lower electrode 31, the capacitor insulating film 32 and the upper electrode 33 compose a capacitor element 34.

Referring to one of significant features of the second embodiment, an upper end part of the lower electrode 31 composing the capacitor element 34 is rounded, and a lower end part of the lower electrode 31 is extended outward so as to be connected to the principal surface of the semiconductor substrate 30 smoothly. In addition, an angle ($\angle$a) formed by the side face with the top face of the lower electrode 31 and an angle ($\angle$b) formed by the side face thereof with the principal surface of the semiconductor substrate 30 are both obtuse.

In the second embodiment, also, when the tapered angles ($\angle$a and $\angle$b) of the lower electrode 31 in island shape are set in the range between 93 degrees and 130 degrees, preferably between 95 degrees and 100 degrees, the breakage rate of the upper electrode 33 can be remarkably small. It is also noted that the upper electrode 33 is preferably set to have a thickness of 10 nm or more.

With the capacitor element 34 in the column shape of the second embodiment, in which the lower electrode 31 in the column shape is made tapered (obtuse) in section, the upper end part of the lower electrode 31 is rounded and the lower part (corner part) of the side face of the lower electrode 31 is extended outward, the coverage at the upper end part and the corner part of the upper electrode 33 is increased. In association, stress on the upper electrode 33 caused by thermal contraction in thermal treatment for crystallization of the capacitor insulating film 33 is uniformed, so as to restrain migration of atoms composing the upper electrode 33, with a result that the upper electrode 33 is prevented from breakage.

It is noted that the upper end part of the lower electrode 31 is rounded and the corner part of the lower end side face is extended outward in the second embodiment but only either one thereof may be so shaped.

In addition, the capacitor element 34 may be provided on another semiconductor layer or another insulating layer formed on the semiconductor substrate 30, instead of on the semiconductor substrate 30 directly.

For example, in the case using a stack memory cell in which a transistor for enabling the capacitor element 15 to be accessible is formed on the semiconductor substrate 10 and the capacitor element 15 is formed above the transistor with the underlying insulating layer 11 intervened, a contact may be formed for electrical conduction between a source or drain of the transistor and the lower electrode 31 of the capacitor element 34.

(Manufacturing Method)

Figure 9A:
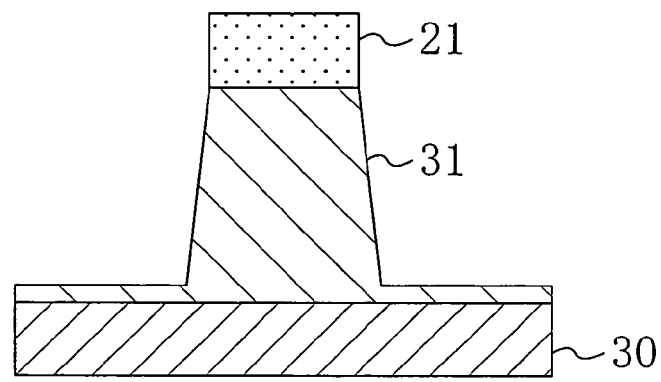
FIG. 9A to FIG. 9C are sections showing the process sequence of a semiconductor device manufacturing method according to the second embodiment of the present invention.
Figure 9B:
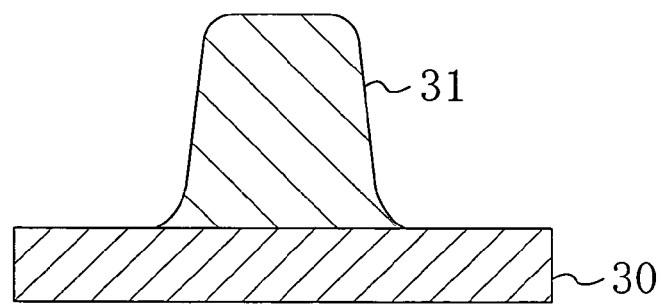
Figure 9C:
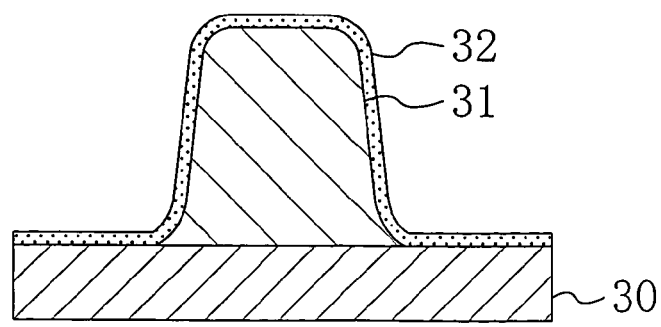
Figure 10A:
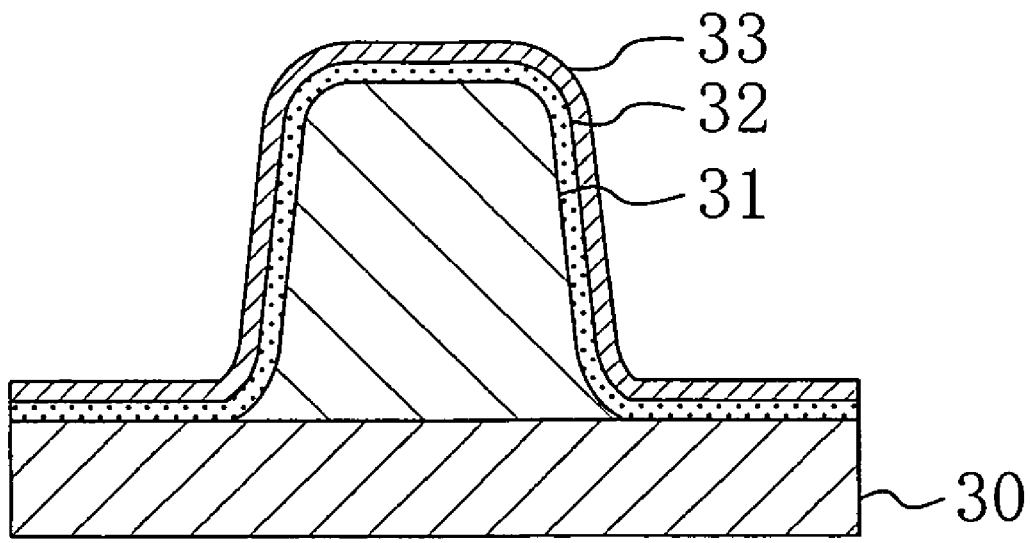
FIG. 10A and FIG. 10B are sections showing the process sequence of the semiconductor device manufacturing method according to the second embodiment of the present invention.
Figure 10B:
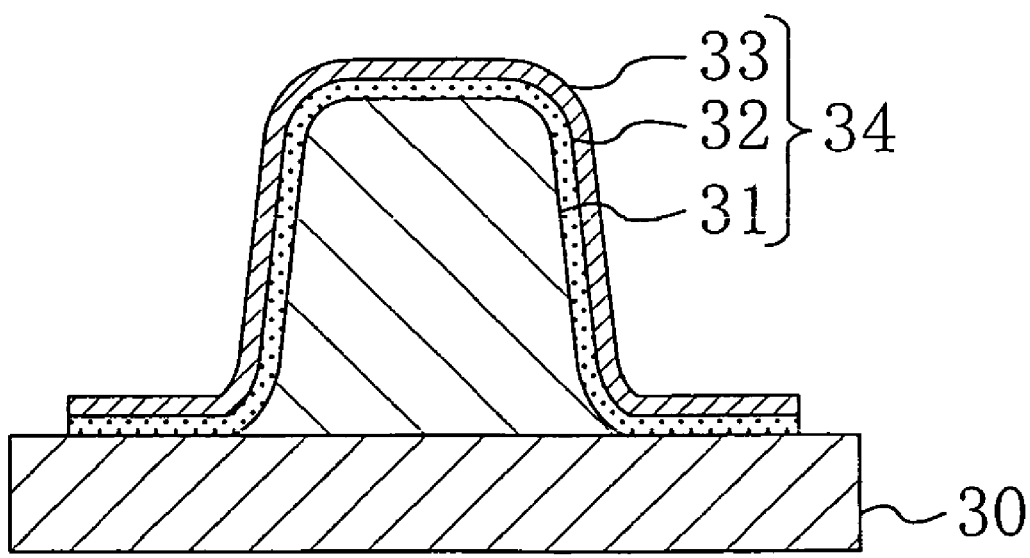

A method for manufacturing a capacitor element constructed as above will be described below with reference to drawings. FIG. 9A to FIG. 9C, FIG. 10A and FIG. 10B show the process sequence of the method for manufacturing a semiconductor device in section according to the second embodiment. In FIG. 9 and FIG. 10, the same reference numerals are assigned to the same members as those in FIG. 8.

First, a lower electrode formation film made of platinum of about 400 nm in thickness is deposited on a semiconductor substrate 30 by sputtering or MOCVD. Then, as shown in FIG. 9A, a resist mask 21 having a lower electrode formation pattern is formed on the lower electrode formation film by lithography and anisotropic dry etching with an etching gas of which principal components are, for example, chlorine ($Cl_2$) and argon (Ar) is performed to the lower electrode formation film, using the resistant mask 21, thereby forming a column-shaped lower electrode 31 from the lower electrode formation film. In this time, the lower electrode formation film is etched so that the lower electrode formation film is left to have a thickness of about 30 nm to 50 nm with the semiconductor substrate 30 around the column-shaped lower electrode 31 not exposed.

Next, as shown in FIG. 9B, after removing the resist mask 21 by ashing, physical sputtering using, for example, argon (Ar) is performed to the column-shaped lower electrode 31. This etching by the physical sputtering with the argon gas allows a sputtered material of the electrode to redeposit to the side face of the lower electrode 31, with a result that the lower part of the side face of the lower electrode 31 is formed curved (rounded). As well, the edge part of the upper end part of the lower electrode 31 is rounded.

By setting the etching condition so that a reaction product of the material (platinum) composing the lower electrode 31 and the etching gas is easily redeposited to the side face of the lower electrode 31, the angle ($\angle$b) formed by the side face of the lower electrode 31 with the principal surface of the semiconductor substrate 30 becomes in an obtuse tapered shape.

Subsequently, as shown in FIG. 9C, a capacitor insulating film 32 made of a ferroelectric, for example, SBTN, of about 60 nm in thickness is deposited on the semiconductor substrate 30 by sputtering or MOCVD so as to cover the lower electrode 31.

Next, as shown in FIG. 10A, an upper electrode 33 made of platinum (Pt) of about 40 nm in thickness is deposited on the capacitor insulating film 32 by sputtering or MOCVD.

Next, as shown in FIG. 10B, the upper electrode 33, the capacitor insulating film 32 and the lower electrode 31 are patterned to desired shapes by lithography and dry etching.

In this patterning, a gas containing chlorine may be used for the upper electrode 33 and the lower electrode 31 and a gas containing fluorine and chlorine (e.g., $CHF_3$, $C_4F_8$ and $CCl_4$) may be used for the capacitor insulating film 32. Then, thermal treatment under an oxidizing atmosphere at a temperature of 650° C. to 800° C. is performed to the thus patterned capacitor insulating film 32 for crystallization of the ferroelectric composing the capacitor insulating film 32.

As described above, according to the second embodiment, the column-shaped lower electrode 31 can have the obtuse tapered angles and the lower electrode 31 can be shaped to have the rounded upper end part and the extended lower end part. Therefore, the coverage at the portions of the upper electrode 33 respectively corresponding to the upper end part and lower end part of the lower electrode 31 is increased. In association, stress on the upper electrode 33 caused by thermal contraction in the thermal treatment for crystallization of the capacitor insulating film 32 is uniformed, so that the upper electrode 33 is prevented from breakage.

(Third Embodiment)

A third embodiment of the present invention will be described below with reference to drawings.

Figure 11:
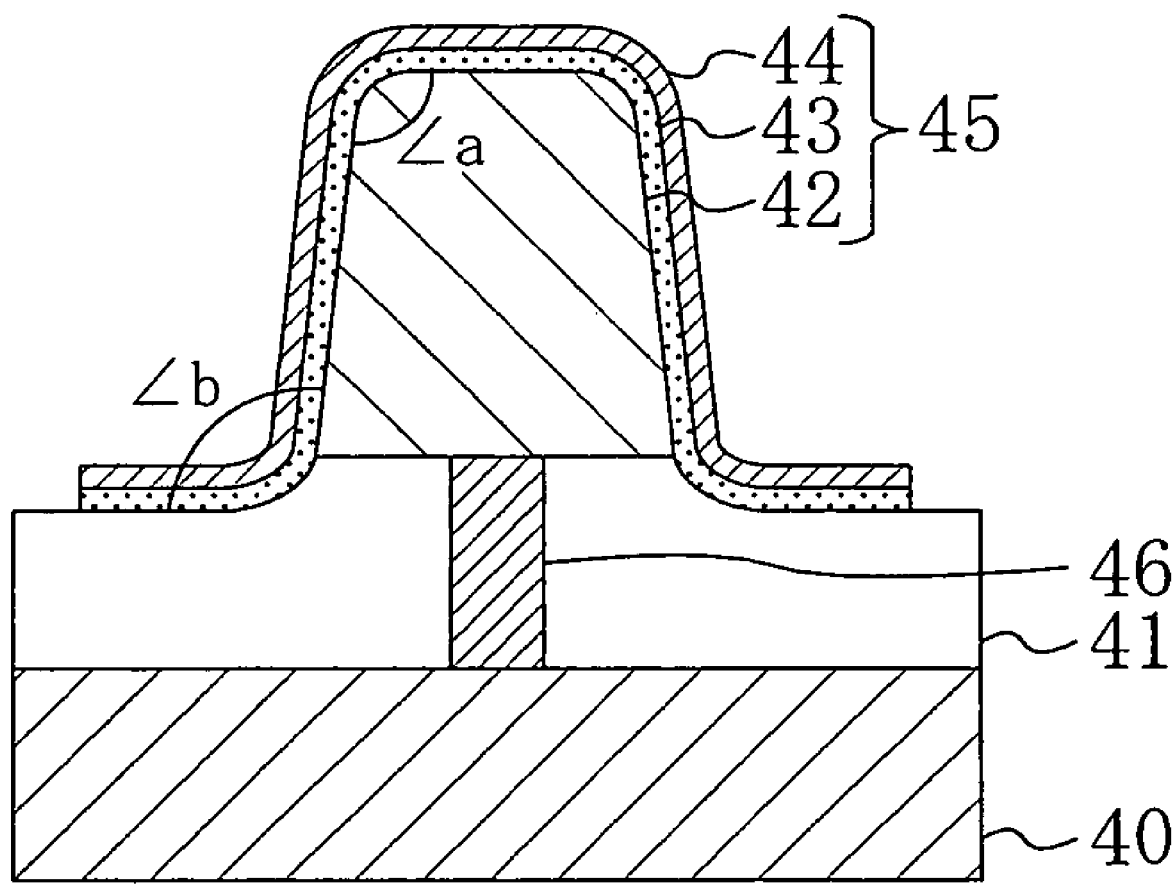
FIG. 11 is a section showing the main part of a semiconductor device (column capacitor element) according to a third embodiment of the present invention.

FIG. 11 shows a capacitor element having a column shape in section, which is a semiconductor device according to the third embodiment of the present invention.

As shown in FIG. 11, an underlying insulating layer 41 of which principal component is silicon oxide of about 500 nm in thickness is formed on a semiconductor substrate 40 made of silicon. A lower electrode 42 made of platinum in a column shape (island shape) having a diameter of about 400 nm and a height of about 400 nm is formed on the underlying insulating layer 41. On the lower electrode 42, a capacitor insulting film 43 made of a ferroelectric, for example, SBTN, of about 60 nm in thickness and an upper electrode 44 made of platinum of about 40 nm in thickness are formed so as to cover the lower electrode 42. The lower electrode 42, the capacitor insulating film 43 and the upper electrode 44 compose a capacitor element 45.

The lower electrode 42 composing the capacitor element 45 is connected electrically with the semiconductor substrate 40 through a contact plug 46 made of, for example, tungsten (W) passing through the underlying insulating layer 41.

Referring to one of significant features of the third embodiment, the upper end part of the lower electrode 42 composing the capacitor element 45 is rounded, and a region where the underlying insulating layer 41 is connected to the side face of the lower electrode 42 is curved inward so that the lower end part of the side face of the lower electrode 42 is connected to the top face of the underlying insulating layer 41 smoothly. Further, an angle ($\angle$a) formed by the side face with the top face of the lower electrode 42 and an angle ($\angle$b) formed by the side face thereof with the top face of the underlying insulating layer 41 are both obtuse.

In the third embodiment, also, when the tapered angles ($\angle$a and $\angle$b) of the lower electrode 42 in the island shape are set in the range between 93 degrees and 130 degrees, preferably between 95 degrees and 100 degrees, the breakage rate of the upper electrode 44 can be remarkably small. It is also noted that the upper electrode 44 is preferably set to have a thickness of 10 nm or more.

With the capacitor element 45 in the column shape according to the third embodiment, in which the lower electrode 42 in the column shape is made tapered (obtuse) in section, the upper end part of the lower electrode 42 is rounded and a region (corner part) where the underlying insulating layer 41 is connected to the side face of the lower electrode 42 is curved inward, the coverage at the upper end part and the corner part of the upper electrode 44 is increased. In association, stress on the upper electrode 44 caused by thermal contraction in thermal treatment for crystallization of the capacitor insulating film 43 is uniformed, so as to restrain migration of atoms composing the upper electrode 44, with a result that the upper electrode 44 is prevented from breakage.

It is noted that the upper end part of the lower electrode 42 is rounded and the corner part connected to the lower end part of the side face of the lower electrode 42 is curved inward in the third embodiment but only either the upper or the corner part may be processed.

In addition, the capacitor element 45 is provided on the underlying insulating layer 41 herein, but may be formed on the semiconductor substrate 41 directly.

(Manufacturing Method)

Figure 12A:
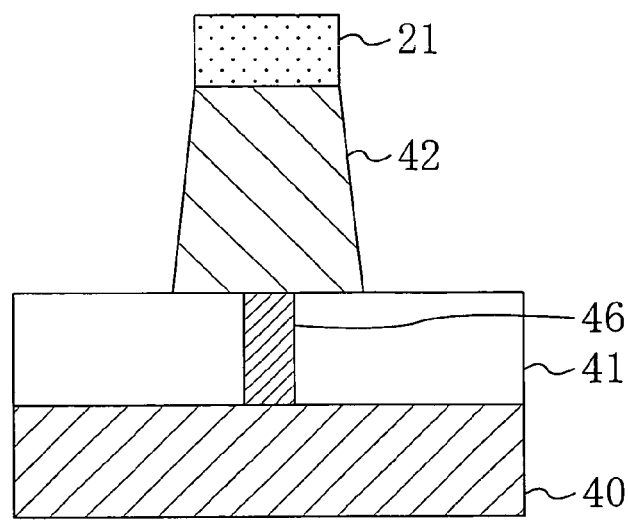
FIG. 12A to FIG. 12C are sections showing the process sequence of a semiconductor device manufacturing method according to the third embodiment of the present invention.
Figure 12B:
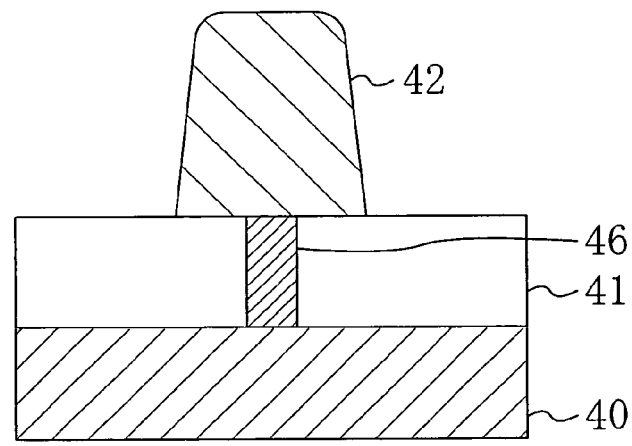
Figure 12C:
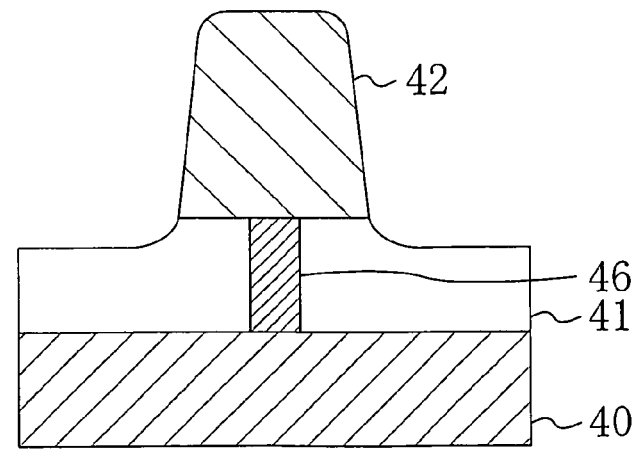
Figure 13A:
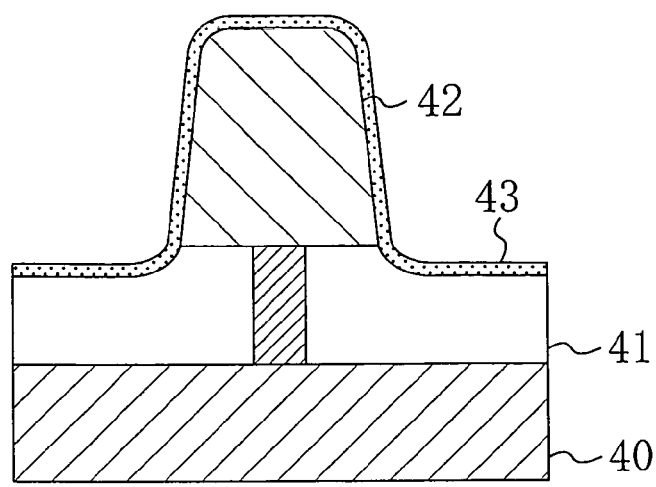
FIG. 13A to FIG. 13C are sections showing the process sequence of the semiconductor device manufacturing method according to the third embodiment of the present invention.
Figure 13B:
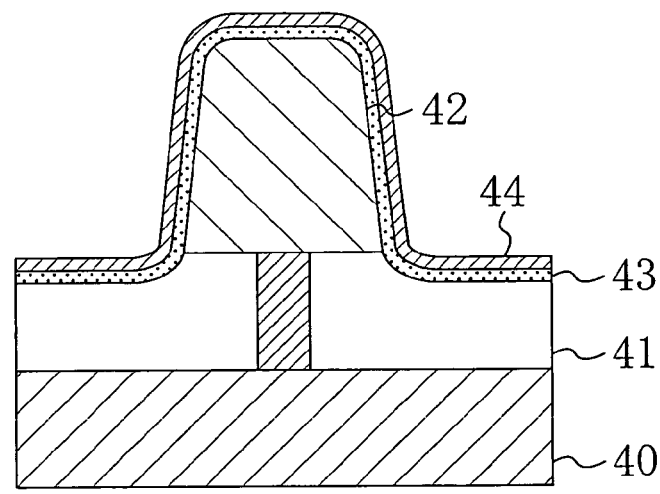
Figure 13C:
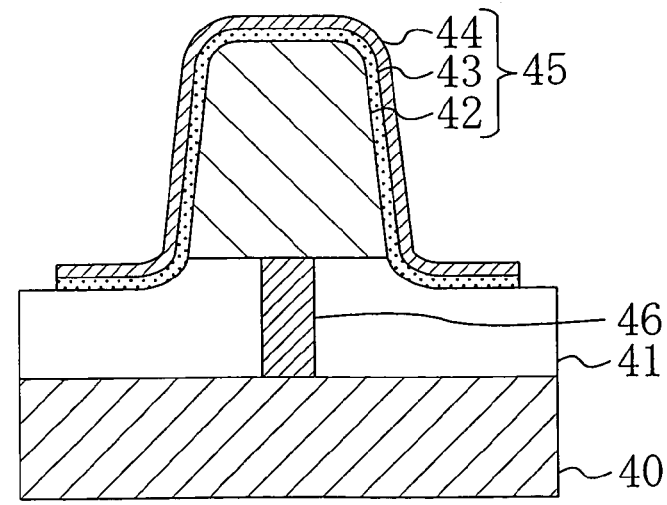

A method for manufacturing a capacitor element constructed as above will be described below with reference to drawings. FIG. 12A to FIG. 12C and FIG. 13A to FIG. 13C show the process sequence of the method for manufacturing a semiconductor device in section according to the third embodiment. In FIG. 12 and FIG. 13, the same reference numerals are assigned to the same members as those in FIG. 11.

First, an underlying insulating layer 41 of which principal component is silicon oxide of about 500 nm in thickness is deposited on a semiconductor substrate 40 by CVD. Then, a contact hole for exposing the semiconductor substrate 40 is selectively formed in the underlying insulating layer 41 by lithography and dry etching, a metal film made of tungsten is deposited on the underlying insulating layer 41 by sputtering or CVD, and then, planrization is performed for exposing the underlying insulating layer 41 by chemical mechanical polishing (CMP), thereby forming a contact plug 46 from the deposited metal film. Then, a lower electrode formation film made of platinum of about 400 nm in thickness is deposited on the underlying insulating layer 41 by sputtering or MOCVD. Then, as shown in FIG. 12A, a resist mask 21 having a lower electrode formation pattern is formed on the lower electrode formation film by lithography and anisotropic dry etching with an etching gas of which principal components are, for example, chlorine ($Cl_2$) and argon (Ar) is performed to the lower electrode formation film, thereby forming a column-shaped lower electrode 42 from the lower electrode formation film. In this etching, by setting the etching condition so that a reaction product of the material (platinum) composing the lower electrode 42 and the etching gas is easily redeposited to the side face of the lower electrode 42, the side face of the lower electrode 42 is tapered.

Next, as shown in FIG. 12B, after removing the resist mask 21 by ashing, physical sputtering using, for example, argon (Ar) is performed to the column-shaped lower electrode 42, thereby rounding the upper end part of the lower electrode 42.

Next, as shown in FIG. 12C, dry etching using a fluorocarbon-based gas ($CHF_3$ or $C_4F_8$) and oxygen ($O_2$) as an etching gas is performed to the underlying insulating layer 41, using the lower electrode 42 as a mask, to process a region where the underlying insulating layer 41 is extended from the lower electrode 42. Herein, it is preferable that: the temperature of the substrate is set comparatively low, approximately room temperature, so that the a reaction product of the material (silicon oxide) composing the underlying insulating layer 41 and the etching gas is easily redeposited to the side face of the underlying insulating layer 41; and the used etching gas has a large carbon rate. Specifically, it is preferable to set the temperature of the semiconductor substrate 40 to be 10° C. to 40° C. and to use an etching gas having a mixed ratio of fluorocarbon and oxygen of 95:5 to 99:1.

Next, as shown in FIG. 13A, a capacitor insulating film 43 made of SBTN of about 60 nm in thickness is deposited on the underlying insulting layer 41 by sputtering or MOCVD so as to cover the lower electrode 42.

Then, as shown in FIG. 13B, an upper electrode 44 made of platinum (Pt) of about 40 nm in thickness is deposited on the capacitor insulating film 43 by sputtering or MOCVD.

Next, as shown in FIG. 13C, the upper electrode 44, the capacitor insulating film 43 and the lower electrode 42 are patterned to desired shapes by lithography and dry etching. In this patterning, a gas containing chlorine may be used for the upper electrode 44 and the lower electrode 42 and a gas containing fluorine or chlorine (e.g., $CHF_3$, $C_4F_8$ and $CCl_4$) may be used for the capacitor insulating film 43. Then, thermal treatment under an oxidizing atmosphere at a temperature of 650° C. to 800° C. is performed to the patterned capacitor insulating film 43 for crystallization of the ferroelectric composing the capacitor insulting film 43.

As described above, according to the third embodiment, the column-shaped lower electrode 42 can have the obtuse tapered angles, the lower electrode 42 can be shaped to have the rounded upper end part, and the underlying insulating layer 41 connected to the lower end thereof can have a curved shape. Therefore, the coverage at parts of the upper electrode 44 respectively corresponding to the upper end part of the lower electrode 42 and the region where the underlying insulating layer 41 is connected to lower end part of the lower electrode 42 is increased. In association, stress on the upper electrode 44 caused by thermal contraction in the thermal treatment for crystallization of the capacitor insulating film 43 is uniformed, so that the upper electrode 44 is prevented from breakage.

(Modified Example of Third Embodiment)

Figure 14:
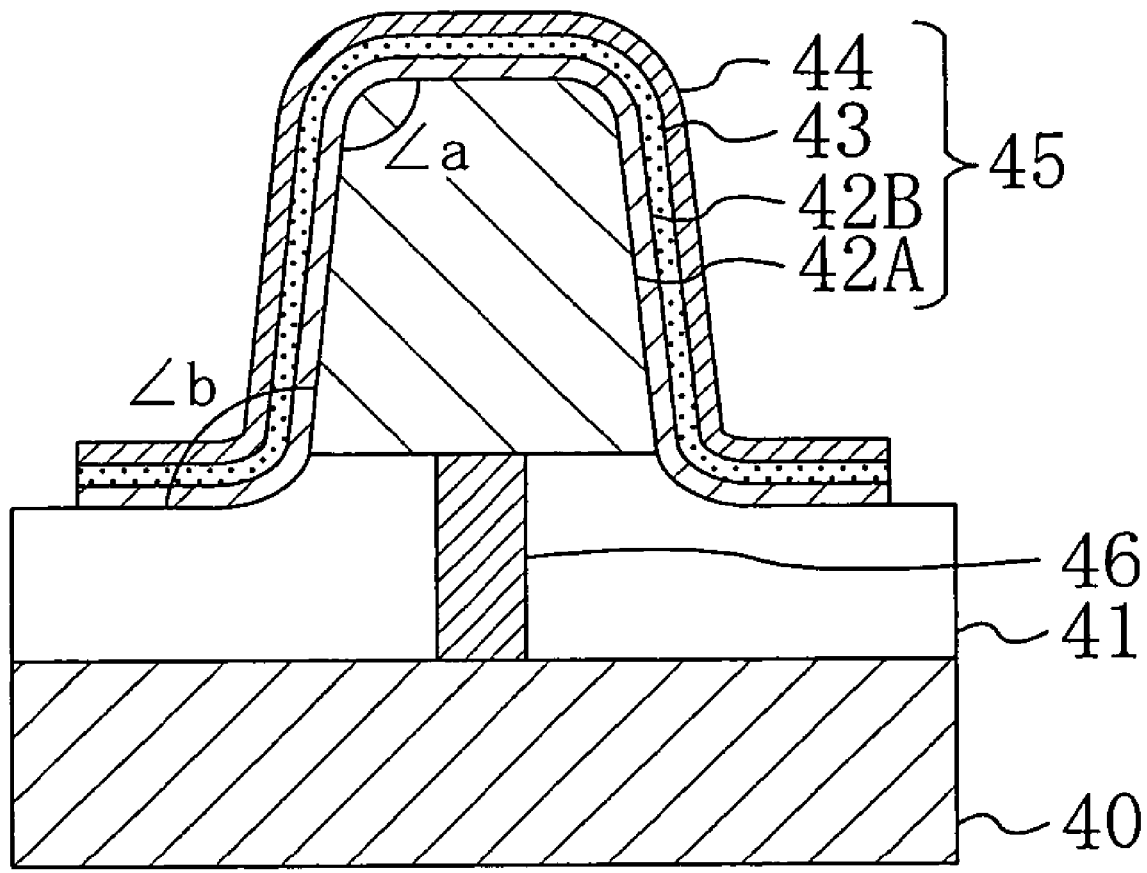
FIG. 14 is a section showing the main part of a semiconductor device (column capacitor element) according to a modified example of the third embodiment of the present invention.

FIG. 14 shows one modified example of the third embodiment. In FIG. 14, the description of the members is omitted by assigning the same reference numerals to the same members as those in FIG. 11.

In this modified example, as shown in FIG. 14, a second lower electrode 42B made of platinum of about 40 nm in thickness is formed between a column-shaped first lower electrode 42A made of platinum of about 400 nm in height and a capacitor insulating film 43 made of SBTN.

In the third embodiment, the periphery of the first lower electrode 42A is dipped down in the underlying insulating layer 41 serving as an underlying layer of the capacitor element 42, and therefore, the substantial height of the capacitor element 42 is increased compared with the case with the periphery thereof not dipped.

In addition, in the present modified example, the second lower electrode 42B extends around the periphery of the dipped underlying insulating layer 41 beyond the lower end part of the column-shaped first lower electrode 42A, and therefore, the area of a region where the second lower electrode 42B faces the upper electrode 44 with the capacitor insulating film 43 intervened is increased, resulting in increase in a capacitor value of the capacitor element 45.

(Fourth Embodiment)

A fourth embodiment of the present invention will be described below with reference to drawings.

Figure 15:
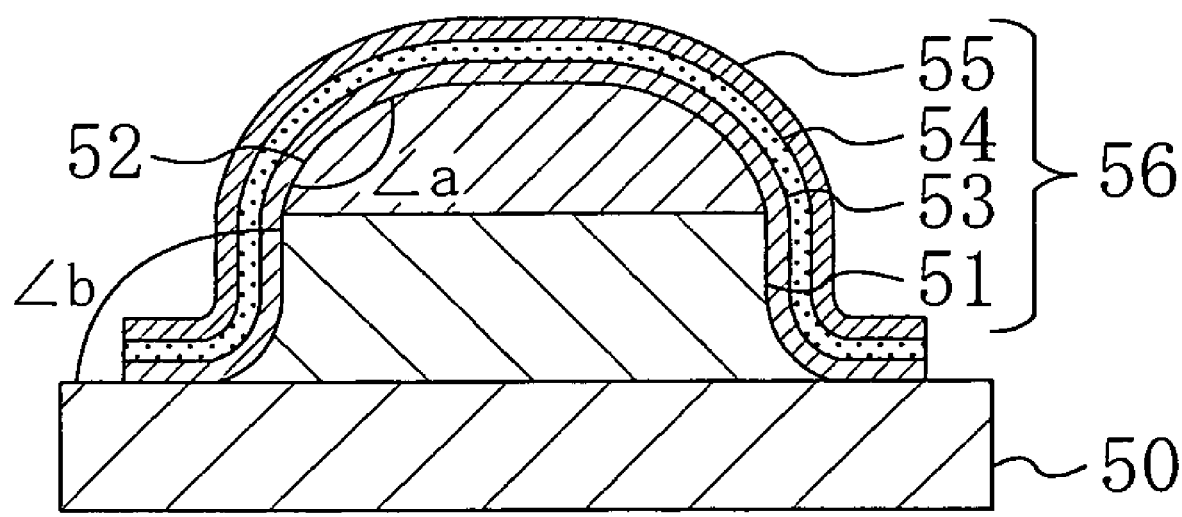
FIG. 15 is a section showing the main part of a semiconductor device (column capacitor element) according to a fourth embodiment of the present invention.

FIG. 15 shows a capacitor element having a column shape in section, which is a semiconductor device according to the fourth embodiment of the present invention.

As shown in FIG. 15, a lower electrode 51 made of platinum in a column shape (island shape) having a diameter of about 400 nm and a height of about 400 nm, and a mask film 52 made of insulating titanium aluminum oxide (TiAlO) of about 100 nm in thickness on the first lower electrode 51 are formed on a semiconductor substrate 50 as an underlying layer made of, for example, silicon. On the semiconductor substrate 50, a second lower electrode 53 made of platinum of about 40 nm in thickness, a capacitor insulating film 54 made of a ferroelectric, for example, SBTN, of about 60 nm in thickness and an upper electrode 55 made of platinum of about 40 nm in thickness are formed so as to cover the mask film 52 and the first lower electrode 51. The first lower electrode 51, the mask film 52, the second lower electrode 53, the capacitor insulating film 54 and the upper electrode 55 compose a capacitor element 56.

Referring to one of significant features of the fourth embodiment, the upper end part of the mask film 52 that covers the first lower electrode 51 composing the capacitor element 56 is rounded, and the lower end part of the first lower end 51 is extended outward so as to be connected to the principal surface of the semiconductor substrate 50 smoothly. Further, an angle ($\angle$a) formed by the side face with the top face of the mask film 52 and an angle ($\angle$b) formed by the side face of the first lower electrode 51 with the principal surface of the semiconductor substrate 50 are both obtuse.

In the fourth embodiment, also, when the respective tapered angles ($\angle$a and $\angle$b) of the mask film 52 and the first lower electrode 51 are set in the range between 93 degrees and 130 degrees, preferably between 95 degrees and 100 degrees, the breakage rate of the second lower electrode 53 and the upper electrode 55 can be remarkably small. It is also noted that the second lower electrode 53 and the upper electrode 55 are preferably set to have a thickness of 10 nm or more.

With the capacitor element 56 in the column shape of the fourth embodiment, in which the column shape of first lower electrode 51 including the mask film 52 is made tapered (obtuse) in section, the upper end part of the mask film 52 covering the top face of the first lower electrode 51 is rounded and a lower part (corner part) of the first lower electrode 51 is curved inward, the coverage at the respective upper end parts and the respective corner parts of the second lower electrode 52 and the upper electrode 55 is increased. In association, stress on the second lower electrode 53 and the upper electrode 55 caused by thermal contraction in thermal treatment for crystallization of the capacitor insulating film 54 is uniformed, so as to restrain migration of atoms composing the electrodes 53, 55. Hence, each electrode 53, 55 is prevented from breakage.

It is noted that the upper end part of the mask film 52 is rounded and the corner part at the side face lower end part of the first lower electrode 51 is curved inward in the fourth embodiment, but only either the mask film 52 or the first lower electrode 51 may be so shaped.

In addition, the capacitor element 56 may be provided on another semiconductor layer or another insulating layer formed on the semiconductor substrate 50, instead of on the semiconductor substrate 50 directly.

For example, in the case using a stack memory cell in which a transistor for enabling the capacitor element 15 to be accessible is formed on the semiconductor substrate 10 and the capacitor element 15 is formed above the transistor with the underlying insulating layer 11 intervened, a contact may be formed for electrical conduction between a source or a drain of the transistor and the first lower electrode 51 of the capacitor element 56.

(Manufacturing Method)

Figure 16A:
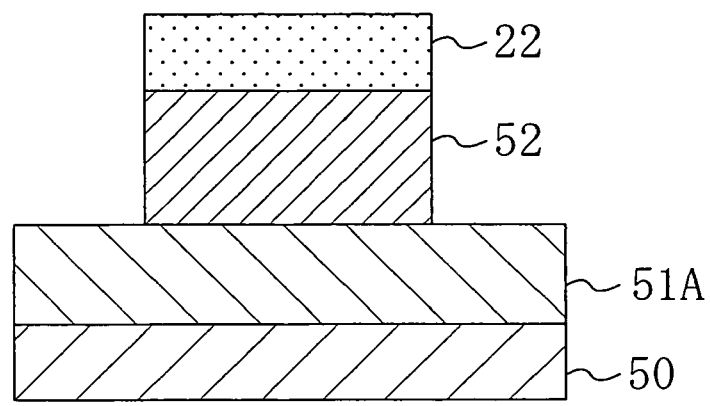
FIG. 16A to FIG. 16C are sections showing the process sequence of a semiconductor device manufacturing method according to the fourth embodiment of the present invention.
Figure 16B:
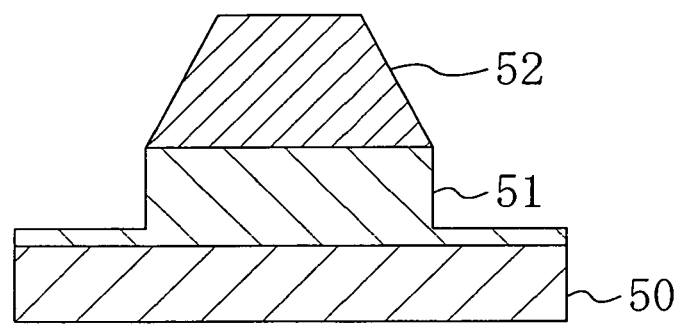
Figure 16C:
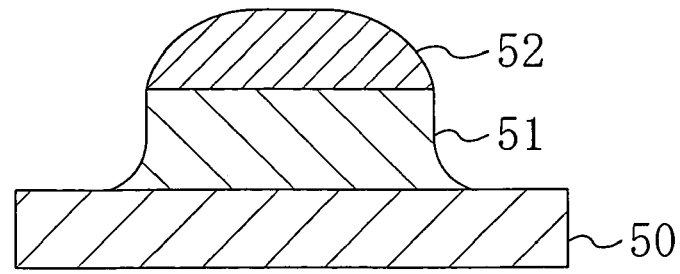
Figure 17A:
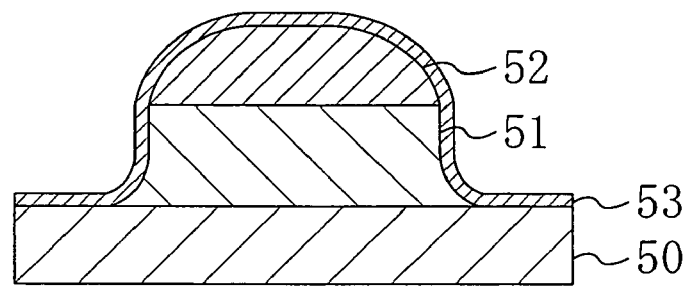
FIG. 17A to FIG. 17C are sections showing the process sequence of the semiconductor device manufacturing method according to the fourth embodiment of the present invention.
Figure 17B:
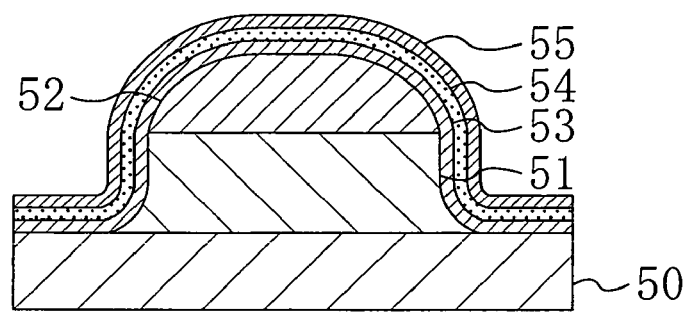
Figure 17C:
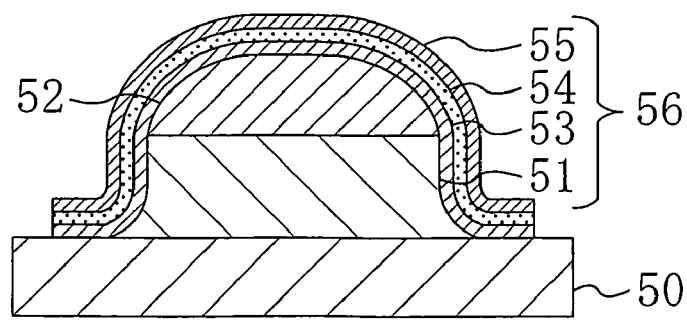

A method for manufacturing a capacitor element constructed as above will be described below with reference to drawings. FIG. 16A to FIG. 16C and FIG. 17A to FIG. 17C show the process sequence of the method for manufacturing a semiconductor device in section according to the fourth embodiment. In FIG. 16 and FIG. 17, the same reference numerals are assigned to the same members as those in FIG. 15.

First, as shown in FIG. 16A, a first lower electrode formation film 51A made of platinum of about 400 nm in thickness is deposited on a semiconductor substrate 50 by sputtering or MOCVD. Thereafter, a mask formation film made of titanium aluminum oxide of about 100 nm in thickness is deposited on the first lower electrode 51A by sputtering. Then, a resist mask 22 having a lower electrode formation pattern is formed on the mask formation film by lithography and anisotropic dry etching with an etching gas of which principal components are, for example, chlorine ($Cl_2$), argon (Ar) and trifluoromethyl ($CHF_3$) is performed to the mask formation film, using the thus formed resist mask 22, thereby forming a mask film 52 from the mask formation film.

Subsequently, as shown in FIG. 16B, after the resist mask 22 is removed by ashing, anisotropic dry etching with an etching gas of which principal components are, for example, chlorine ($Cl_2$), argon (Ar) and oxygen ($O_2$) is performed to the first lower electrode formation film 51A, using the thus formed mask film 52, thereby forming a first lower electrode 51 in an island shape from the first lower electrode formation film 51A. In this etching, the first lower electrode formation film 51A is etched so as to leave the lower electrode formation film to have a thickness of about 30 nm to 50 nm with the semiconductor substrate 50 around the column-shaped first lower electrode 51 not exposed.

Next, as shown in FIG. 16C, physical sputtering using an argon gas is performed to the mask film 52 to round the upper end part of the mask film 52. At the same time, the material of the electrode sputtered by the physical sputtering etching with the argon gas redeposits to the side face of the first lower electrode 51, thereby forming the lower part of the side face of the first lower electrode 51 into a curved (rounded) shape.

Next, as shown in FIG. 17A, a second lower electrode 53 made of platinum (Pt) of about 40 nm in thickness is deposited on the semiconductor substrate 50 by sputtering or MOCVD so as to cover the mask film 52 and the first lower electrode 51.

Subsequently, as shown in FIG. 17B, a capacitor insulating film 54 made of SBTN of about 60 nm in thickness is deposited on the semiconductor substrate 50 by sputtering or MOCVD so as to cover the second lower electrode 53, and then, an upper electrode 55 made of platinum (Pt) of about 40 nm in thickness is deposited on the capacitor insulating film 54 by sputtering or MOCVD.

Next, as shown in FIG. 17C, the upper electrode 55, the capacitor insulating film 54 and the second lower electrode 53 are patterned to desired shapes by lithography and dry etching. In the patterning performed in this time, a gas containing chlorine may be used for the upper electrode 55 and the second lower electrode 53 and a gas containing fluorine or chlorine (e.g., $CHF_3$, $C_4F_8$ or $CCl_4$) may be used for the capacitor insulating film 54. Then, thermal treatment under an oxidizing atmosphere at a temperature of 650° C. to 800° C. is performed to the thus patterned capacitor insulating film 54 for crystallization of the ferroelectric composing the capacitor insulating film 54.

As described above, according to the fourth embodiment, the column shape of the lower electrode 51 including the mask film 52 can have the obtuse tapered angles, the upper end part of the mask film 52 is rounded and the lower end part of the first lower electrode 51 can be formed into the curved shape. Therefore, the coverage at the portions of the second lower electrode 53 and the upper electrode 55 respectively corresponding to the upper end part of the mask film 52 and respectively corresponding to the lower end part of the first lower electrode 51 is increased. In association, stress on the second lower electrode 53 and the upper electrode 55 caused by thermal contraction in the thermal treatment for crystallization of the capacitor insulating film 54 is uniformed, so that the second lower electrode 53 and the upper electrode 55 are prevented from breakage.

Moreover, in the fourth embodiment, the second lower electrode 53, the capacitor insulating film 54 and the upper electrode 55 are formed on the mask film 52, generally called a hard mask, which has not been removed, after the first lower electrode 51 is formed using the mask film 52. Therefore, the area where the second lower electrode 53 faces the upper electrode 55 can be increased according to the increased height (thickness) by the mask film 52 formed on the first lower electrode 51 even if the first lower electrode 51 made of a precious metal such as platinum has a small thickness. Hence, the capacitor value of the capacitor element 56 can be ensured sufficiently while reducing the respective amounts of the material used and etched for forming the electrodes that is hard to be processed.

Wherein, the insulting titanium aluminum oxide (TiAlO) is used as a material of the mask film 52, but the material of the mask film 52 is not limited thereto and may be conductive titanium aluminum nitride (TiAlN). In addition, silicon oxide ($SiO_2$), silicon nitride (SiN), aluminum oxide ($Al_2O_3$), titanium oxide ($TiO_2$) or tantalum oxide ($Ta_2O_5$) may be used as an insulating material of the mask film 52. Or, titanium (Ti) or tantalum (Tr) may be used as a conductive material thereof.

(Fifth Embodiment)

A fifth embodiment of the present invention will be described below with reference to drawings.

Figure 18:
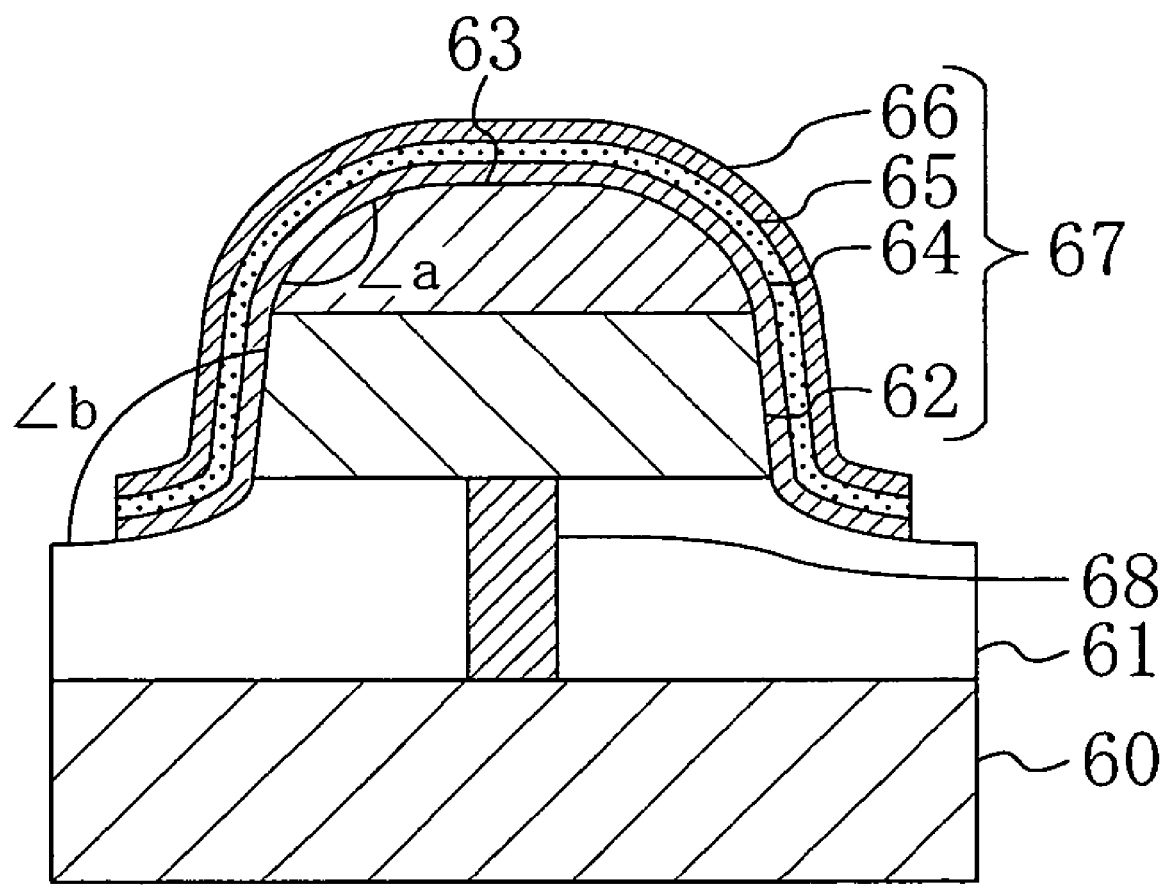
FIG. 18 is a section showing the main part of a semiconductor device (column capacitor element) according to a fifth embodiment of the present invention.

FIG. 18 shows a capacitor element having a column shape in section, which is a semiconductor device according to the fifth embodiment of the present invention.

As shown in FIG. 18, an underlying insulating layer 61 of which principal component is silicon oxide of about 500 nm in thickness is formed on a semiconductor substrate 60 made of silicon. A first lower electrode 62 made of platinum in an island shape having a diameter of about 400 nm and a height of about 400 nm and a mask film 63 made of insulating titanium aluminum oxide (TiAlO) of about 100 nm in thickness on the first lower electrode 62 are formed on the underlying insulating layer 61. On the underlying insulating layer 61, a second lower electrode 64 made of platinum of about 40 nm in thickness, a capacitor insulating film 65 made of a ferroelectric, for example, SBTN, of about 60 nm in thickness, and an upper electrode 66 made of platinum of about 40 nm in thickness are formed so as to cover the mask film 63 and the first lower electrode 42. The first lower electrode 62, the mask film 63, the second lower electrode 64, the capacitor insulating film 65 and the upper electrode 66 compose a capacitor element 67.

The first lower electrode 62 composing the capacitor element 67 is connected electrically to the semiconductor substrate 60 through a contact plug 68 made of, for example, tungsten (W) passing vertically through the underlying insulting layer 61.

Referring to one of significant features of the fifth embodiment, the upper end part of the mask film 63 that covers the first lower electrode 62 composing the capacitor element 67 is rounded, and a region where the underlying insulating layer 61 is connected to the side face of the first lower electrode 62 is curved inward so that the lower end part of the side face of the first lower electrode 62 is connected to the top face of the underlying insulating layer 61 smoothly. Further, an angle (∠a) formed by the side face with the top face of the mask film 63 with an angle (∠b) formed by the side face of the first lower electrode 62 with the top face of the underlying insulating layer 61 are both obtuse.

In the fifth embodiment, also, when the respective tapered angles (∠a and ∠b) of the mask film 63 and the first lower electrode 62 are set in the range between 93 degrees and 130 degrees, preferably between 95 degrees and 100 degrees, each breakage rate of the second lower electrode 64 and the upper electrode 66 can be remarkably small. It is also noted that the second lower electrode 64 and the upper electrode 66 are preferably set to have a thickness of 10 nm or more.

With the capacitor element 56 in the column shape of the fifth embodiment, in which the column shape of the first lower electrode 62 including the mask film 63 is made tapered (obtuse) in section, the upper end part of the mask film 63 covering the top face of the first lower electrode 62 is rounded and a lower part (corner part) of the first lower electrode 62 is curved inward, the coverage at the respective upper end parts and the respective corner parts of the second lower electrode 64 and the upper electrode 66 is increased. In association, stress on the second lower electrode 64 and the upper electrode 66 caused by thermal contraction in thermal treatment for crystallization of the capacitor insulating film 65 is uniformed, so as to restrain migration of atoms composing the electrodes 64, 66. Hence, each electrode 64, 66 is prevented from breakage.

It is noted that the upper end part of the mask film 63 is rounded and the corner part of the lower face side part of the first lower electrode 62 is curved inward in the fifth embodiment, but either the mask film 63 or the first lower electrode 62 may be so shaped.

In addition, the capacitor element 67 is formed on the underlying insulating layer 61 herein, but may be form on the semiconductor substrate 60 directly.

(Manufacturing Method)

Figure 19A:
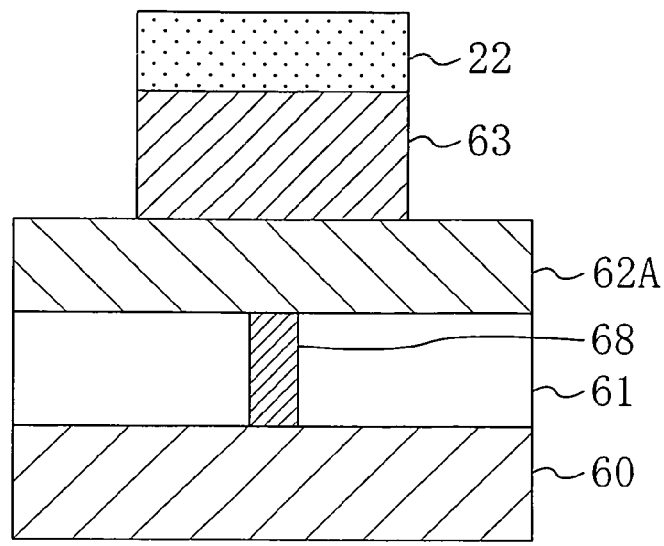
FIG. 19A to FIG. 19C are sections showing the process sequence of a semiconductor device manufacturing method according to the fifth embodiment of the present invention.
Figure 19B:
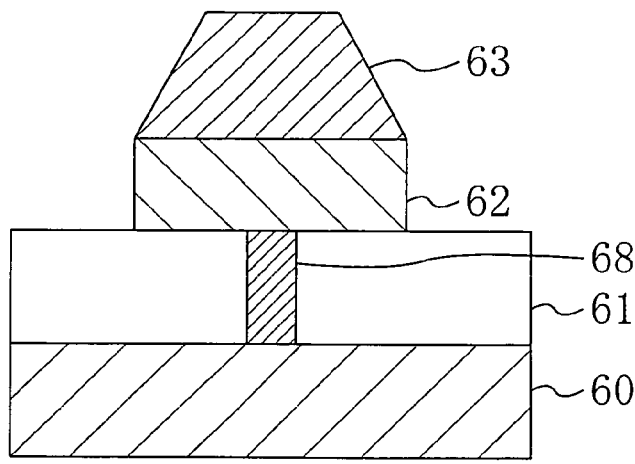
Figure 19C:
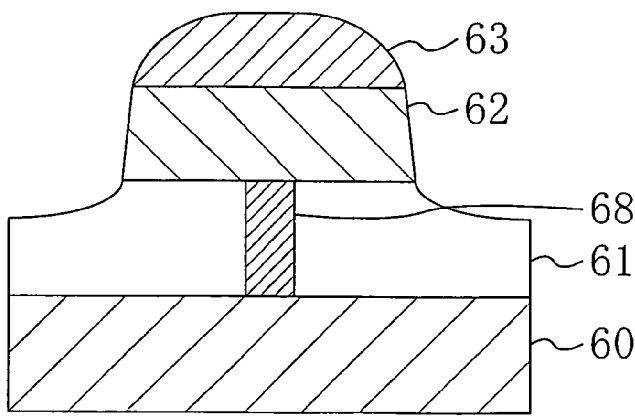
Figure 20A:
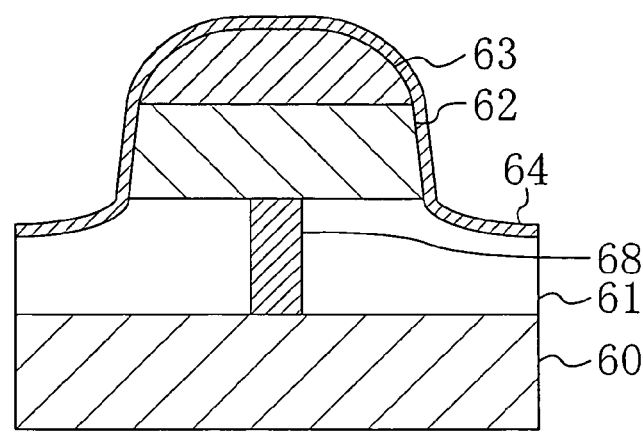
FIG. 20A to FIG. 20C are sections showing the process sequence of the semiconductor device manufacturing method according to the fifth embodiment of the present invention.
Figure 20B:
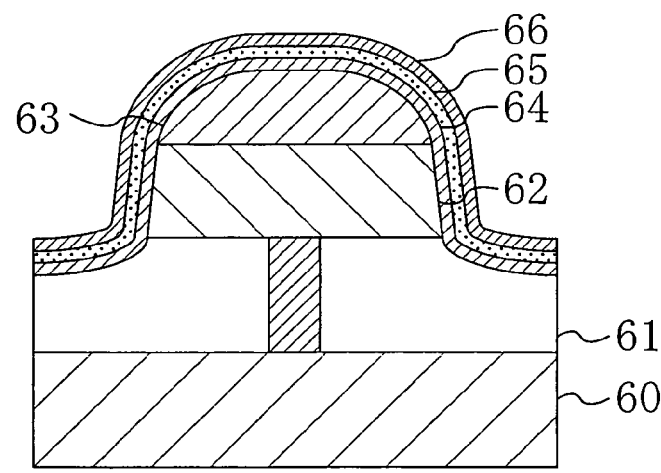
Figure 20C:
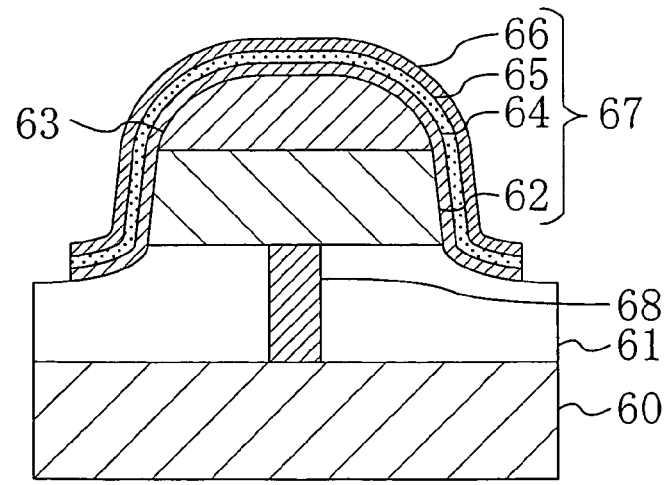

A method for manufacturing a capacitor element costructed as above will be described below with reference to drawings. FIG. 19A to FIG. 19C and FIG. 20A to FIG. 20C show the process sequence of the method for manufacturing a semiconductor device in section according to the fifth embodiment. In FIG. 19 and FIG. 20, the same reference numerals are assigned to the same members as those in FIG. 18.

First, as shown in FIG. 19A, an underlying insulating layer 61 of which principal component is silicon oxide of about 500 nm in thickness is deposited on a semiconductor substrate 60 by CVD. Then, a contact hole for exposing the semiconductor substrate 60 is formed selectively in the underlying insulating layer 61 by lithography and dry etching, a metal film made of tungsten is deposited on the underlying insulating layer 61 by sputtering or CVD, and then, planarization is performed by CMP to expose the underlying insulating layer 61, thereby forming a contact plug 68 from the deposited metal film. Subsequently, a first lower electrode formation film 62A made of platinum of about 400 nm in thickness is deposited on the semiconductor substrate 60 by sputtering or MOCVD. Thereafter, a mask formation film made of titanium aluminum oxide of about 100 nm in thickness is deposited on the first lower electrode formation film 52A by sputtering. Then, a resist mask 22 having a lower electrode formation pattern is formed on the mask formation film by lithography and anisotropic dry etching with an etching gas of which principal components are chlorine ($Cl_2$), argon (Ar) and trifluoromethyl ($CHF_3$) is performed to the mask formation film, using the thus formed resist mask 22, thereby forming a mask film 63 from the mask formation film.

Next, as shown in FIG. 19B, after the resist mask 22 is removed by ashing, anisotropic dry etching with an etching gas of which principal components are, for example, chlorine ($Cl_2$), argon (Ar) and oxygen ($O_2$) is performed to the first lower electrode formation film 62A, using the thus formed mask film 63, thereby forming a first lower electrode 62 in an island shape from the first lower electrode formation film 62A.

Next, as shown in FIG. 19C, dry etching using a fluorocarbon-based gas ($CHF_3$ or $C_4F_8$) and oxygen ($O_2$) as an etching gas is performed to the underlying insulating layer 61, using the mask film 63 and the first lower electrode 62 as masks, to process a region where the underlying insulating layer 61 extends outwardly from the first lower electrode 62 is formed in an inwardly curved shape. Herein, it is preferable that: the temperature of the substrate is set comparatively low, approximately room temperature, so that a reaction product of the material (silicon oxide) composing the underlying insulating layer 61 and the etching gas is easily redeposited to the side face of the underlying insulating layer 61; and the used etching gas has a large carbon rate. Specifically, it is preferable to set the temperature of the semiconductor substrate 60 to be 10° C. to 40° C. and to use an etching gas having a mixed ratio of fluorocarbon and oxygen of 95:5 to 99:1.

Subsequently, as shown in FIG. 20A, a second lower electrode made of platinum (Pt) of about 40 nm in thickness is deposited on the underlying insulating layer 61 by sputtering or MOCVD so as cover the mask film 63 and the first lower electrode 62.

Next, as shown in FIG. 20B, a capacitor insulating film 65 made of SBTN of about 60 nm in thickness is deposited on the underlying insulating layer 61 by sputtering or MOCVD so as to cover the second lower electrode 64, and then, an upper electrode 66 made of platinum (Pt) of about 40 nm in thickness is deposited on the capacitor insulating film 65 by sputtering or MOCVD.

Next, as shown in FIG. 20C, the upper electrode 66, the capacitor insulating film 65 and the second lower electrode 64 are patterned to desired shapes by lithography and dry etching. In the patterning performed in this time, a gas containing chlorine may be used for the upper electrode 66 and the second lower electrode 64 and a gas containing fluorine or chlorine (e.g., $CHF_3$, $C_4F_8$ or $CCl_4$) may be used for the capacitor insulating film 65. Then, thermal treatment under an oxidizing atmosphere at a temperature of 650° C. to 800° C. is performed to the thus patterned capacitor insulating film 65 for crystallization of the ferroelectric composing the capacitor insulating film 65.

As described above, according to the fifth embodiment, the column shape of the first lower electrode 62 including the mask film 63 can have the obtuse tapered angles, the upper end of the mask film 63 is rounded and the underlying insulating layer 61 connected to the lower end part of the first lower electrode 62 can be formed to have the curved shape. Therefore, the coverage at the portions of the second lower electrode 64 and the upper electrode 66 respectively corresponding to the upper end part of the mask film 63 and the region where the underlying insulating layer 61 is connected to the lower end part of the first lower electrode 62 is increased. In association, stress on the second lower electrode 64 and the upper electrode 64 caused by thermal contraction in the thermal treatment for crystallization of the capacitor insulating film 65 is uniformed, so that the second lower electrode 64 and the upper electrode 66 are prevented from breakage.

Moreover, in the fifth embodiment, the second lower electrode 64, the capacitor insulating film 65 and the upper electrode 66 are formed on the mask film 63, generally called a hard mask, which has not been removed, after the first lower electrode 62 is formed using the mask film 63. Therefore, the area where the second lower electrode 64 faces the upper electrode 66 can be increased according to the increased height (thickness) by the mask film 63 formed on the first lower electrode 62 even if the first lower electrode 62 made of a precious metal such as platinum has a small thickness. Hence, the capacitor value of the capacitor element 67 can be ensured sufficiently while reducing the respective amounts of the material used and etched for forming the electrodes that is hard to be processed.

In addition, the periphery of the first lower electrode 62 is dipped down in the underlying insulating layer 61 serving as an underlying layer of the capacitor element 67, and therefore, the substantial height of the capacitor element 42 is increased compared with the case with the periphery thereof not dipped. Thus, the capacitor value of the capacitor element 67 can be further increased.

Wherein, titanium aluminum oxide (TiAlO) is used as a material of the mask film 63, but the material of the mask film 63 is not limited thereto and may be conductive titanium aluminum nitride (TiAlN). In addition, silicon oxide ($SiO_2$), silicon nitride (SiN), aluminum oxide ($Al_2O_3$), titanium oxide ($TiO_2$) or tantalum oxide ($Ta_2O_5$) may be used as an insulating material of the mask film 63. Or, titanium (Ti) or tantalum (Tr) may be used as a conductive material thereof.

Moreover, SBTN (=$SrBi_2(Ta_xNb_{1-x})_2O_9$) is used as a material of each capacitor insulting film in the first to fifth embodiments, but the material of the capacitor insulating film is not limited thereto and may be a ferroelectric such as lead zirconium titanate ($Pb(Zr_xTi_{1-x})O_3$), barium strontium titanate ($Ba_xSr_{1-x})TiO_3$), bismuth lanthanum titanate ($Bi_xLa_{1-x})_4Ti_3O_{12}$), wherein $0 \leq x \leq 1$ in each substance, or a high-dielectric such as tantalum pentoxide ($Ta_2O_5$).

Furthermore, platinum (Pt) is used for each upper electrode and each lower electrode composing the respective capacitor elements, but the material thereof is not limited thereto and may be ruthenium (Ru), ruthenium oxide ($RuO_y$), iridium (Ir), iridium oxide ($IrO_y$) titan aluminum (TiAl), titanium aluminum nitride (TiAlN), titanium (Ti), titanium nitride (TiN), tantalum (Ta) or tantalum nitride (TaN).

As described above, the semiconductor device of the present invention has effects that: the coverage is increased in the formation of the electrodes composing the capacitor element; and breakage of the electrodes can be prevented even after the thermal treatment to the capacitor insulating film. Thus, the present invention is useful in application to a semiconductor devices having a capacitor element of which capacitor insulating film is made of a ferroelectric or a high-dielectric.

What is claimed is:

1. A semiconductor device, comprising:
    an underlying layer, which is a deposited film, having an insulating property and having a concave portion in a surface portion;
    a lower electrode formed on said underlying layer along an inner face of said concave portion;
    a capacitor insulating film formed on said lower electrode and made of a high-dielectric or a ferroelectric; and
    an upper electrode formed on said capacitor insulating film,
    wherein an upper end pan of a side face and a corner part at a bottom face of said concave portion of said underlying layer are rounded,
    said side face of said concave portion forms an angle with said bottom face of said concave portion and an angle with a surface of said underlying layer respectively at 93 degrees to 130 degrees,
    in each of said lower electrode and said upper electrode, a thickness ratio of a thinnest part in a part located on said inner face of said concave portion to a part located on said underlying layer is 0.6 or more, and
    in each of said upper electrode and said lower electrode, a thickness of a thinnest part is 10 nm or more.

2. The semiconductor device of claim 1, wherein
    said capacitor insulating film is made of at least one material selected from the group consisting $Pb(Zr_xTi_{1-x})O_3$, $(Ba_xSr_{1-x})TiO_3$, $SrBi_2(Ta_xNb_{1-x})_2O_9$, $(Bi_xLa_{1-x})_4Ti_3O_{12}$ (wherein, $0 \leq x \leq 1$ in each said substance) and $Ta_2O_5$.

3. The semiconductor device of claim 1, wherein
    said upper electrode and said lower electrode are made of at least one material selected from the group consisting of platinum, ruthenium, ruthenium oxide, iridium, iridium oxide, aluminum titanium, aluminum titanium nitride, titanium, titanium nitride, tantalum and tantalum nitride.

4. The semiconductor device of claim 1, further comprising: a substrate having a plane main surface,
    wherein said underlying layer is formed on said main surface of said substrate.

* * * * *